(12) United States Patent
Yu et al.

(10) Patent No.: US 10,504,930 B2
(45) Date of Patent: Dec. 10, 2019

(54) REFLECTIVE LIQUID CRYSTAL DISPLAY PANEL

(71) Applicant: HannStar Display Corporation, Taipei (TW)

(72) Inventors: Ming-Chang Yu, Taichung (TW);
Cheng-Yen Yeh, Taichung (TW);
Chen-Hao Su, Taichung (TW);
Yu-Chen Liu, Taichung (TW)

(73) Assignee: HannStar Display Corporation, Taipei (TW)

( * ) Notice: Subject to any disclaimer, the term of this patent is extended or adjusted under 35 U.S.C. 154(b) by 102 days.

(21) Appl. No.: 15/638,399

(22) Filed: Jun. 30, 2017

(65) Prior Publication Data

US 2018/0145089 A1    May 24, 2018

(30) Foreign Application Priority Data

Nov. 18, 2016 (CN) .......................... 2016 1 1014828
Mar. 23, 2017 (CN) .......................... 2017 1 0177124

(51) Int. Cl.

| | |
|---|---|
| *H01L 27/12* | (2006.01) |
| *G02F 1/136* | (2006.01) |
| *H01L 29/417* | (2006.01) |
| *G02F 1/1343* | (2006.01) |
| *G02B 27/01* | (2006.01) |

(Continued)

(52) U.S. Cl.
CPC ............ *H01L 27/124* (2013.01); *G02F 1/136* (2013.01); *G02F 1/134309* (2013.01); *H01L 27/1255* (2013.01); *H01L 29/41733* (2013.01); *G02B 2027/0138* (2013.01); *G02F 1/133553* (2013.01); *G02F 1/133707* (2013.01); *G02F 2001/134318* (2013.01); *G02F 2001/134345* (2013.01); *G02F 2201/123* (2013.01); *G02F 2201/52* (2013.01); *G02F 2203/02* (2013.01); *G02F 2203/30* (2013.01)

(58) Field of Classification Search
CPC ........................................ G02F 2001/134345
See application file for complete search history.

(56) References Cited

U.S. PATENT DOCUMENTS

| 5,235,448 A * | 8/1993 | Suzuki .................. G02F 1/1368 257/59 |
| 2002/0047822 A1* | 4/2002 | Senda ...................... G09G 3/32 345/90 |

(Continued)

*Primary Examiner* — Alexander P Gross
(74) *Attorney, Agent, or Firm* — JCIPRNET

(57) ABSTRACT

A reflective LCD panel includes a plurality of pixel units, each of which includes: first and second substrates, first and second scan lines, first and second data lines, a liquid crystal layer, and first, second, third, and fourth pixel structures. The first and second scan lines and the first and second data lines are disposed on the first substrate. Each of the first, second, third, and fourth pixel structures is electrically connected to one of the first and second scan lines and one of the first and second data lines, respectively. The first, second, third, and fourth pixel structures respectively include: an active component and a reflective pixel electrode electrically connected to the active component, and a reflective area ratio of the first, second, third, and fourth pixel structures is 1:2:4:8 or 2:1:4:8. Here, 16 gray scales may be displayed for achieving better visual effects.

18 Claims, 16 Drawing Sheets

(51) Int. Cl.
    *G02F 1/1335*    (2006.01)
    *G02F 1/1337*    (2006.01)

(56) References Cited

U.S. PATENT DOCUMENTS

2002/0118326 A1* 8/2002 Sakamoto ......... G02F 1/133553
                                                       349/113
2008/0049176 A1* 2/2008 Kim .................. G02F 1/133555
                                                       349/114
2008/0088774 A1* 4/2008 Fan Jiang ......... G02F 1/133753
                                                       349/114

* cited by examiner

REFLECTIVE LIQUID CRYSTAL DISPLAY PANEL

CROSS-REFERENCE TO RELATED APPLICATION

This application claims the priority benefit of Chinese patent application serial no. 201611014828.8, filed on Nov. 18, 2016, and Chinese patent application serial no. 201710177124.0, filed on Mar. 23, 2017. The entirety of each of the above-mentioned patent application is hereby incorporated by reference herein and made a part of the specification.

FIELD OF THE INVENTION

The invention relates to a liquid crystal display (LCD) panel, and more particularly, to a reflective LCD panel.

DESCRIPTION OF RELATED ART

E-papers and e-books have experienced rapid progress in recent years. Reflective display equipment is usually adopted by the e-papers and e-books for displaying images, and a display medium used by the reflective display equipment includes liquid crystal, an electrophoretic display medium, an electrochromic display medium, an electrolytic precipitation display medium, etc., wherein a reflective liquid crystal display (LCD) having liquid crystal has attracted the most attention. Generally speaking, although black and white are sufficient for merely displaying texts, black and white become insufficient if pictures are to be displayed in multiple scales. Currently, insufficient gray scales leading to poor visual effects are still problems for the reflective LCD; therefore, how to expand the number of the gray scales becomes one of a goal for researchers to achieve.

SUMMARY OF THE INVENTION

The invention provides a reflective liquid crystal display (LCD) panel capable of displaying 16 gray scales and achieving good visual effects.

In an embodiment of the invention, a reflective LCD panel includes a plurality of pixel units, wherein each of the pixel units includes a first substrate, a first scan line, a second scan line, a first data line, a second data line, a first pixel structure, a second pixel structure, a third pixel structure, a fourth pixel structure, a second substrate, and a liquid crystal layer. The first scan line, the second scan line, the first data line, and the second data line are disposed on the first substrate. The first pixel structure, the second pixel structure, the third pixel structure, and the fourth pixel structure are electrically connected to one of the first scan line and the second scan line and one of the first data line and the second data line, respectively, wherein the first pixel structure, the second pixel structure, the third pixel structure, and the fourth pixel structure respectively include an active component and a reflective pixel electrode electrically connected to the active component. A reflective area ratio of the first pixel structure, the second pixel structure, the third pixel structure, and the fourth pixel structure is 1:2:4:8 or 2:1:4:8. The second substrate is disposed opposite to the first substrate. The liquid crystal layer is disposed between the first substrate and the second substrate.

In view of the foregoing, in the reflective LCD panel provided in the invention, the first pixel structure, the second pixel structure, the third pixel structure, and the fourth pixel structure with the reflective area ratio of 1:2:4:8 or 2:1:4:8 are included in each of the pixel units, and thereby the reflective LCD panel may display 16 gray scales and thus may provide good visual effects.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
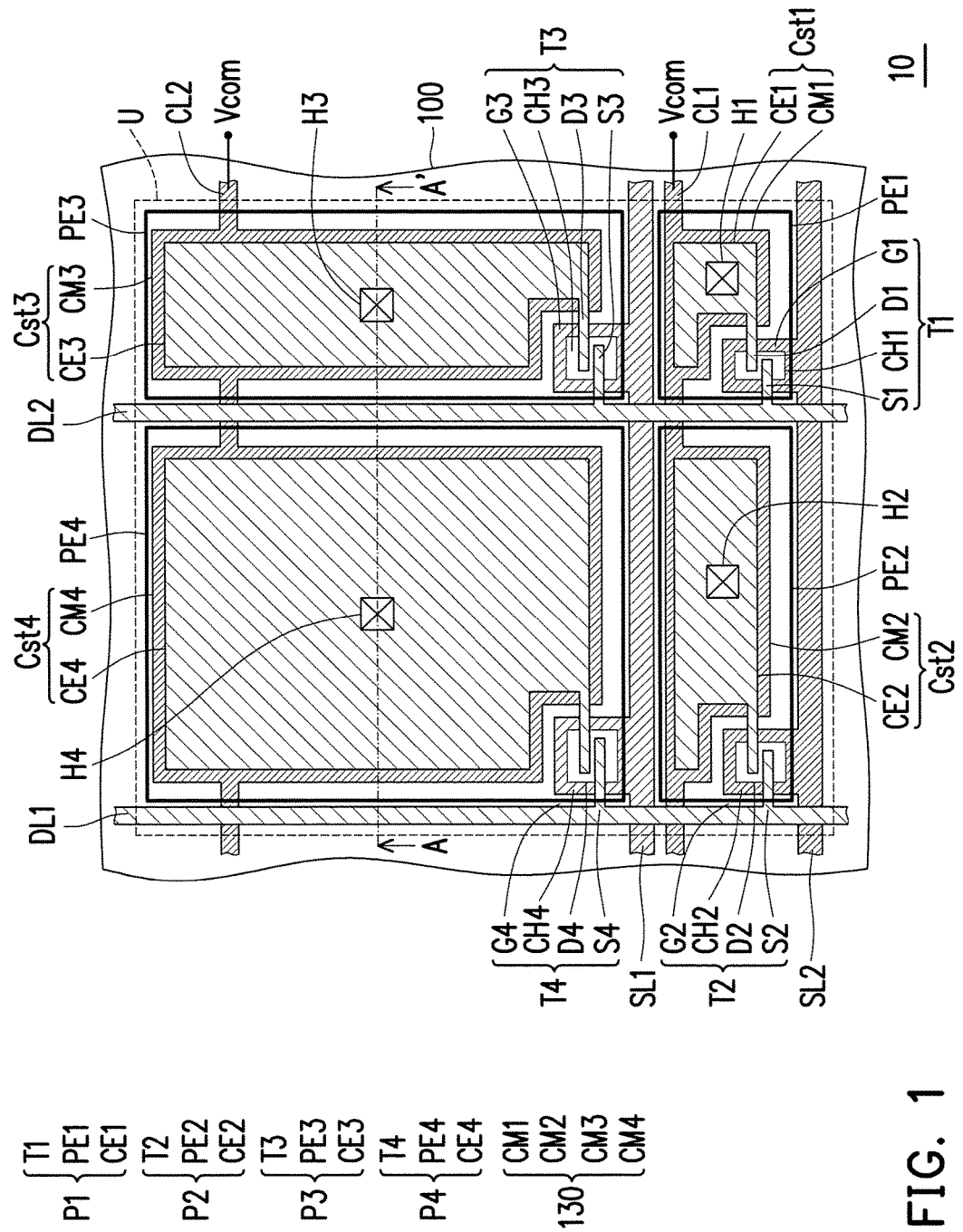
FIG. 1 is a schematic top view of a reflective liquid crystal display (LCD) panel according to a first embodiment of the invention.
Figure 2:
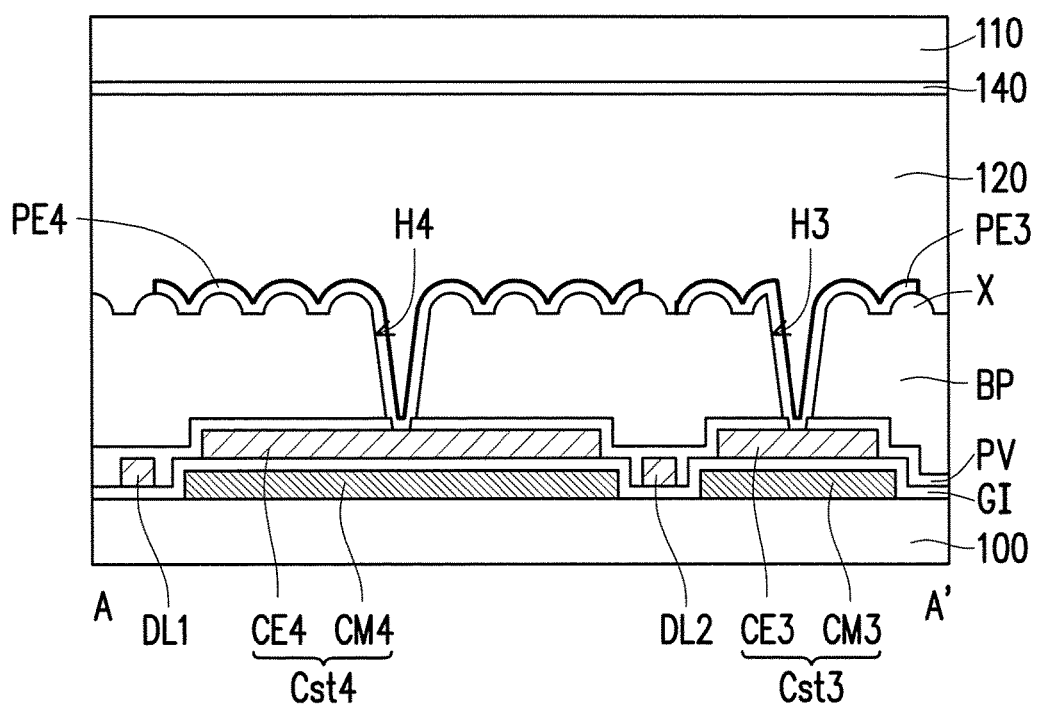
FIG. 2 is a schematic cross-sectional diagram of a sectional line A-A' in FIG. 1.

FIG. 1 is a schematic top view of a reflective liquid crystal display (LCD) panel according to a first embodiment of the invention. FIG. 2 is a schematic cross-sectional diagram of a sectional line A-A' in FIG. 1.

Referring to FIG. 1 and FIG. 2, a reflective LCD panel 10 includes a plurality of pixel units U. Specifically, each of the pixel units U includes a first substrate 100, a first scan line SL1, a second scan line SL2, a first data line DL1, a second data line DL2, a first pixel structure P1, a second pixel structure P2, a third pixel structure P3, a fourth pixel structure P4, a second substrate 110, and a liquid crystal layer 120. Moreover, in the embodiment, each pixel unit U also includes a common electrode layer 130, an insulation layer PV, a cover layer BP, and an opposite electrode layer 140. To facilitate the illustration, only one pixel unit U is illustrated in FIG. 1, but in fact, the reflective LCD panel includes a plurality of the pixel units U arranged in an array; moreover, components such as the second substrate 110, the opposite electrode layer 140, the liquid crystal layer 120, the cover layer BP, the insulation layer PV, and a gate insulation layer GI are not shown in FIG. 1.

In the embodiment, an operation mode of the reflective LCD panel 10 is, for example, an electrically controlled birefringence (ECB) mode, a vertical alignment (VA) mode, a twist nematic (TN) mode, an in plane switch (IPS) mode, a fringe field switch (FFS) mode, and an optically compensated bend (OCB) mode. Therefore, the reflective LCD panel 10 provided in the embodiment is not limited to the illustrations in FIG. 1 and FIG. 2, and people having ordinary skill in the art should understand that the reflective LCD panel 10 may be further configured to include other necessary components, such as an alignment film, a polarizing plate, etc.

In addition, according to the embodiment, a scanning frequency of a scan signal of the reflective LCD panel 10 is higher than 0 and less than or equal to 20 Hz and preferably falls between 0.5 Hz and 15 Hz. For example, the scanning action is performed on the condition that the scan signal has the scanning frequency of 1 Hz. In other words, the reflective LCD panel 10 is suitable for being operated at a low frequency and is thus energy-saving.

The first substrate 100 may be made of glass, quartz, sapphire, or an organic polymer. The second substrate 110 is disposed opposite to the first substrate 100. The second substrate 110 may be made of glass, quartz, sapphire, or an organic polymer. The organic polymer is, for example, polyimide (PI), polymethylmethacrylate (PMMA), polycarbonate (PC), or polyethylene terephthalate (PET).

The liquid crystal layer 120 is disposed between the first substrate 100 and the second substrate 110. Specifically, the liquid layer 120 includes a plurality of liquid crystal molecules (not shown), and suitable liquid crystal molecules may be selected and used according to different operation modes.

The opposite electrode layer 140 is disposed on the second substrate 110 and is disposed between the second substrate 110 and the liquid crystal layer 120. The opposite electrode layer 140 is made of, for example, a material with a high transmittance rate, such as indium-tin oxide (ITO), indium-zinc oxide (IZO), aluminum-tin oxide (ATO), aluminum-zinc oxide (AZO), or a combination thereof. In addition, according to the embodiment, the liquid crystal molecules of the liquid crystal layer 120 are driven by an electric field between the pixel structures (i.e. first pixel structure P1, the second pixel structure P2, the third pixel structure P3, the fourth pixel structure P4) and the opposite electrode layer 140.

The first scan line SL1, the second scan line SL2, the first data line DL1, and the second data line DL2 are disposed on the first substrate 100. The extending direction of the first scan line SL1 and the second scan line SL2 is different from the extending direction of the first data line DL1 and the second data line DL2, and the extending direction of the first scan line SL1 and the second scan line SL2 is preferably perpendicular to the extending direction of the first data line DL1 and the second data line DL2.

In addition, the first scan line SL1 and the second scan line SL2 are located in one layer, and the first data line DL1 and the second data line DL2 are located in another layer. The gate insulation layer GI is located between the first and second scan lines SL1 and SL2 and the first and second data lines DL1 and DL2, which will be described in detail below. Considering electrical conductivity, the first scan line SL1, the second scan line SL2, the first data line DL1, and the second data line DL2 are generally made of metal. However, the invention is not limited hereto, and according to other embodiments, the first scan line SL1, the second scan line SL2, the first data line DL1, and the second data line DL2 may also be made of other conductive materials (e.g., alloy, metal nitride, metal oxide, metal oxynitride, and so forth) or a stack layer having metal and the aforesaid conductive materials.

The first pixel structure P1, the second pixel structure P2, the third pixel structure P3, and the fourth pixel structure P4 are electrically connected to one of the first scan line SL1 and the second scan line SL2 and one of the first data line DL1 and the second data line DL2, respectively. Specifically, in the embodiment, the first pixel structure P1 is electrically connected to the second scan line SL2 and the second data line DL2, the second pixel structure P2 is electrically connected to the second scan line SL2 and the first data line DL1, the third pixel structure P3 is electrically connected to the first scan line SL1 and the second data line DL2, and the fourth pixel structure P4 is electrically connected to the first scan line SL1 and the first data line DL1. In other words, in the embodiment, the second pixel structure P2 and the fourth pixel structure P4 are electrically connected to the first data line DL1, the first pixel structure P1 and the third pixel structure P3 are electrically connected to the second data line DL2, the third pixel structure P3 and the fourth pixel structure P4 are electrically connected to the first scan line SL1, and the first pixel structure P1 and the second pixel structure P2 are electrically connected to the second scan line SL2.

In the embodiment, the first pixel structure P1 includes an active component T1, a reflective pixel electrode PE1, and a capacitor electrode CE1; the second pixel structure P2 includes an active component T2, a reflective pixel electrode PE2, and a capacitor electrode CE2; the third pixel structure P3 includes an active component T3, a reflective pixel electrode PE3, and a capacitor electrode CE3; the fourth pixel structure P4 includes an active component T4, a reflective pixel electrode PE4, and a capacitor electrode CE4.

In the embodiment, the active component T1, the active component T2, the active component T3, and the active component T4 may be bottom-gate thin-film transistors (TFTs) or top-gate TFTs. The active component T1 includes a gate G1, a channel layer CH1, a drain D1, and a source S1; the active component T2 includes a gate G2, a channel layer CH2, a drain D2, and a source S2; the active component T3 includes a gate G3, a channel layer CH3, a drain D3, and a source S3; the active component T4 includes a gate G4, a channel layer CH4, a drain D4, and a source S4.

Taking the bottom-gate TFT as an example, the gates G1 and G2 and the second scan line SL2 constitute a continuous conductive pattern, and the gates G3 and G4 and the first scan line SL1 constitute a continuous conductive pattern, which indicates that the gates G1 and G2 are electrically connected to the second scan line SL2, and that the gates G3 and G4 are electrically connected to the first scan line SL1. In other words, in the embodiment, the gates G1 and G4, the first scan line SL1, and the second scan line SL2 belong to the same layer.

The channel layers CH1 to CH4 are respectively located above the gates G1 to G4. In the embodiment, the channel layers CH1 to CH4 are made of, for example, amorphous silicon or an oxide semiconductor material, wherein the oxide semiconductor material includes indium-gallium-zinc oxide (IGZO), zinc oxide, tin oxide (SnO), IZO, gallium-zinc oxide (GZO), zinc-tin oxide (ZTO), or ITO. In other words, in the embodiment, the active components T1 to T4 are, for example, amorphous silicon (a-Si) TFTs or oxide semiconductor TFTs. Nevertheless, the invention is not limited hereto. In other embodiments, the active components T1 to T4 may also be low-temperature poly-silicon TFTs. In a preferred embodiment, if an oxide semiconductor material (e.g. IGZO) is adopted, and the scanning action is performed on the condition that the scan signal has the scanning frequency between 0.5 Hz and 2 Hz, the reflective LCD panel provided in the invention may be considerably power-saving.

The source S1 and the drain D1 are located above the channel layer CH1, the source S2 and the drain D2 are located above the channel layer CH2, the source S3 and the drain D3 are located above the channel layer CH3, and the source S4 and the drain D4 are located above the channel layer CH4. The sources S1 and S3 and the second data line DL2 constitute a continuous conductive pattern, and the sources S2 and S4 and the first data line DL1 constitute a continuous conductive pattern, which indicates that the sources S1 and S3 are electrically connected to the second data line DL2, and that the sources S2 and S4 are electrically connected to the first data line DL1. The drains D1 to D4 and the capacitor electrodes CE1 to CE4 respectively constitute a continuous conductive pattern, indicating that the drains D1 to D4 are respectively and electrically connected to the capacitor electrodes CE1 to CE4. In addition, according to the embodiment, the drains D1 to D4, the sources S1 to S4, the capacitor electrodes CE1 to CE4, the first data line DL1, and the second data line DL2 belong to the same layer.

In addition, according to the embodiment, the gate insulation layer GI is further disposed between the gate G1 and the channel layer CH1, between the gate G2 and the channel layer CH2, between the gate G3 and the channel layer CH3, and between the gate G4 and the channel layer CH4, wherein the gate insulation layer GI is formed on the first substrate 100 and covers the gates G1 to G4; and the insulation layer PV further covers the active component T1, the active component T2, the active component T3, and the active component T4 so as to protect the active component T1, the active component T2, the active component T3, and the active component T4. The gate insulation layer GI and the insulation layer PV may be made of an inorganic material, an organic material, or a combination of both, wherein the inorganic material is, for example, silicon oxide, aluminum oxide, silicon nitride, silicon oxynitride, or a stack layer having at least two of the above materials; the organic material is, for example, polyimide resin, epoxy resin, acrylic resin, or other polymer materials.

Moreover, according to the embodiment, the cover layer BP is further disposed on the insulation layer PV, and the cover layer BP covers the active component T1, the active component T2, the active component T3, and the active component T4, wherein the thickness of the cover layer BP may be greater than the thickness of the insulation layer PV. Specifically, the top of the cover layer BP includes a plurality of bumps X; in other words, the cover layer BP has an uneven surface. The cover layer BP may be made of a an inorganic material, an organic material, or a combination of both, wherein the inorganic material is, for example, silicon oxide, silicon nitride, silicon oxynitride, or a stack layer having at least two of the above materials, and the organic material is, for example, polyimide resin, epoxy resin, acrylic resin, or other polymer materials.

The reflective pixel electrodes PE1 to PE4 are electrically connected to the active components T1 to T4, respectively. Specifically, the reflective pixel electrode PE1 is electrically connected to the capacitor electrode CE1 through a contact hole H1, the reflective pixel electrode PE2 is electrically connected to the capacitor electrode CE2 through a contact hole H2, the reflective pixel electrode PE3 is electrically connected to the capacitor electrode CE3 through a contact hole H3, and the reflective pixel electrode PE4 is electrically connected to the capacitor electrode CE4 through a contact hole H4. More specifically, the contact hole H1 is disposed in the cover layer BP and the insulation layer PV for exposing part of the capacitor electrode CE1, the contact hole H2 is disposed in the cover layer BP and the insulation layer PV for exposing part of the capacitor electrode CE2, the contact hole H3 is disposed in the cover layer BP and the insulation layer PV for exposing part of the capacitor electrode CE3, and the contact hole H4 is disposed in the cover layer BP and the insulation layer PV for exposing part of the capacitor electrode CE4.

The material of the reflective pixel electrodes PE1 to PE4 includes, for example, silver (Ag), aluminum (Al), or other conductive materials having high reflectivity. The thickness of the reflective pixel electrodes PE1 to PE4, for example, falls between 50 nm and 200 nm. In addition, in order to prevent the reflective pixel electrodes PE1 to PE4 from oxidizing and thus affecting a reflection efficiency, a transparent protection layer may be disposed on the reflective pixel electrodes PE1 to PE4, respectively, and the transparent protection layer is made of, for example, ITO, IZO, ATO, AZO, or other transparent conductive materials.

Moreover, in the embodiment, the reflective pixel electrodes PE1 to PE4 cover the bumps X of the cover layer BP; therefore, the reflective pixel electrodes PE1 to PE4 have uneven surfaces, which is conducive to increasing light reflectivity and expanding reflective view angle distribution of the reflective LCD panel 10.

It is worth mentioning that in the embodiment, the area ratio of the reflective pixel electrode PE1, the reflective pixel electrode PE2, the reflective pixel electrode PE3, and the reflective pixel electrode PE4 is 1:2:4:8. In other words, in the embodiment, the reflective area ratio of the first pixel structure P1, the second pixel structure P2, the third pixel structure P3, and the fourth pixel structure P4 is 1:2:4:8. Since the first pixel structure P1, the second pixel structure P2, the third pixel structure P3, and the fourth pixel structure P4 have the specific reflective area ratio, the reflective LCD panel 10 may display 16 gray scales and achieve good visual effects.

In all of the embodiments provided herein, the area proportion relationship (e.g., the reflective area ratio of the first pixel structure P1, the second pixel structure P2, the third pixel structure P3, and the fourth pixel structure P4 is 1:2:4:8) may fall within a error range acceptable to any technical field pertinent to the invention; that is to say, the error range is within a range of ±10% of an accurate value. For example, the reflective area ratio of the first pixel structure P1 and the second pixel structure P2 provided herein is 1:2, which indicates the reflective area ratio of the first pixel structure P1 and the second pixel structure P2 may fall within the range from 1:1.9 to 1:2.2; the same range is also applicable to the reflective area ratio of the third pixel structure P3 and the fourth pixel structure P4.

Furthermore, in the embodiment, one pixel unit U includes four pixel structures (i.e., the first pixel structure P1, the second pixel structure P2, the third pixel structure P3, and the fourth pixel structure P4), and the reflective area ratio is 1:2:4:8; therefore, when the liquid layer 120 is controlled by the first pixel structure P1, the second pixel structure P2, the third pixel structure P3, and the fourth pixel structure P4, one pixel unit U is capable of displaying 16 gray scales. For example, if an ambient light passes through the liquid layer 120 corresponding to the first pixel structure P1 but fails to pass through the liquid crystal layer 120 corresponding to the second, the third, and the fourth pixel structures P2 to P4, the reflective area capable of reflecting the ambient light in one pixel unit U accounts for 1/15 of all the reflective area that may reflect the ambient light, which is defined as one gray scale state. Another example is that if the ambient light passes through the liquid layer 120 corresponding to the first pixel structure P1 and the second pixel unit P2 but fails to pass through the liquid crystal layer 120 corresponding to the third pixel structure P3 and the fourth pixel structure P4, the reflective area capable of reflecting the ambient light in one pixel unit U accounts for 3/15 of all the reflective area that may reflect the ambient light, which is defined as another gray scale state. As such, there may be 16 gray scales in the invention, which should however not be construed as a limitation to the invention. In other embodiments, one pixel unit U may also include a fifth pixel structure; that is to say, one pixel unit U may also include five pixel structures. In this case, if the reflective area ratio of the five pixel structures is 1:2:4:8:16, there may be 32 gray scales.

In the embodiment, each pixel unit U further includes the common electrode layer 130, and the common electrode layer 130 is disposed on the first substrate 100 and is electrically insulated from the reflective pixel electrodes PE1 to PE4. Specifically, in the embodiment, the common electrode layer 130 includes a plurality of common electrode patterns CM1 to CM4, wherein the common electrode pattern CM1 corresponds to the capacitor electrode CE1 of the first pixel structure P1, the common electrode pattern CM2 corresponds to the capacitor electrode CE2 of the second pixel structure P2, the common electrode pattern CM3 corresponds to the capacitor electrode CE3 of the third pixel structure P3, and the common electrode pattern CM4 corresponds to the capacitor electrode CE4 of the fourth pixel structure P4. In addition, according to the embodiment, the common electrode layer 130, the gates G1 to G4, the first scan line SL1, and the second scan line SL2 belong to the same layer. As such, a storage capacitor Cst1 is constituted by the common electrode pattern CM1 of the common electrode layer 130 and the capacitor electrode CE1 of the first pixel structure P1, a storage capacitor Cst2 is constituted by the common electrode pattern CM2 of the common electrode layer 130 and the capacitor electrode CE2 of the second pixel structure P2, a storage capacitor Cst3 is constituted by the common electrode pattern CM3 of the common electrode layer 130 and the capacitor electrode CE3 of the third pixel structure P3, and a storage capacitor Cst4 is constituted by the common electrode pattern CM4 of the common electrode layer 130 and the capacitor electrode CE4 of the fourth pixel structure P4; furthermore, the gate insulation layer GI disposed between the capacitor electrodes CE1 to CE4 and the common electrode patterns CM1 to CM4 serves as a capacitor dielectric layer of the storage capacitors Cst1 to Cst4.

From another point of view, in the embodiment, the common electrode pattern CM1 and the common electrode pattern CM2 are connected to each other and form a common electrode line CL1, the common electrode pattern CM3 and the common electrode pattern CM4 are connected to each other and form a common electrode line CL2, and the common electrode line CL1 and the common electrode line CL2 are electrically connected to a common voltage Vcom.

Figure 3:
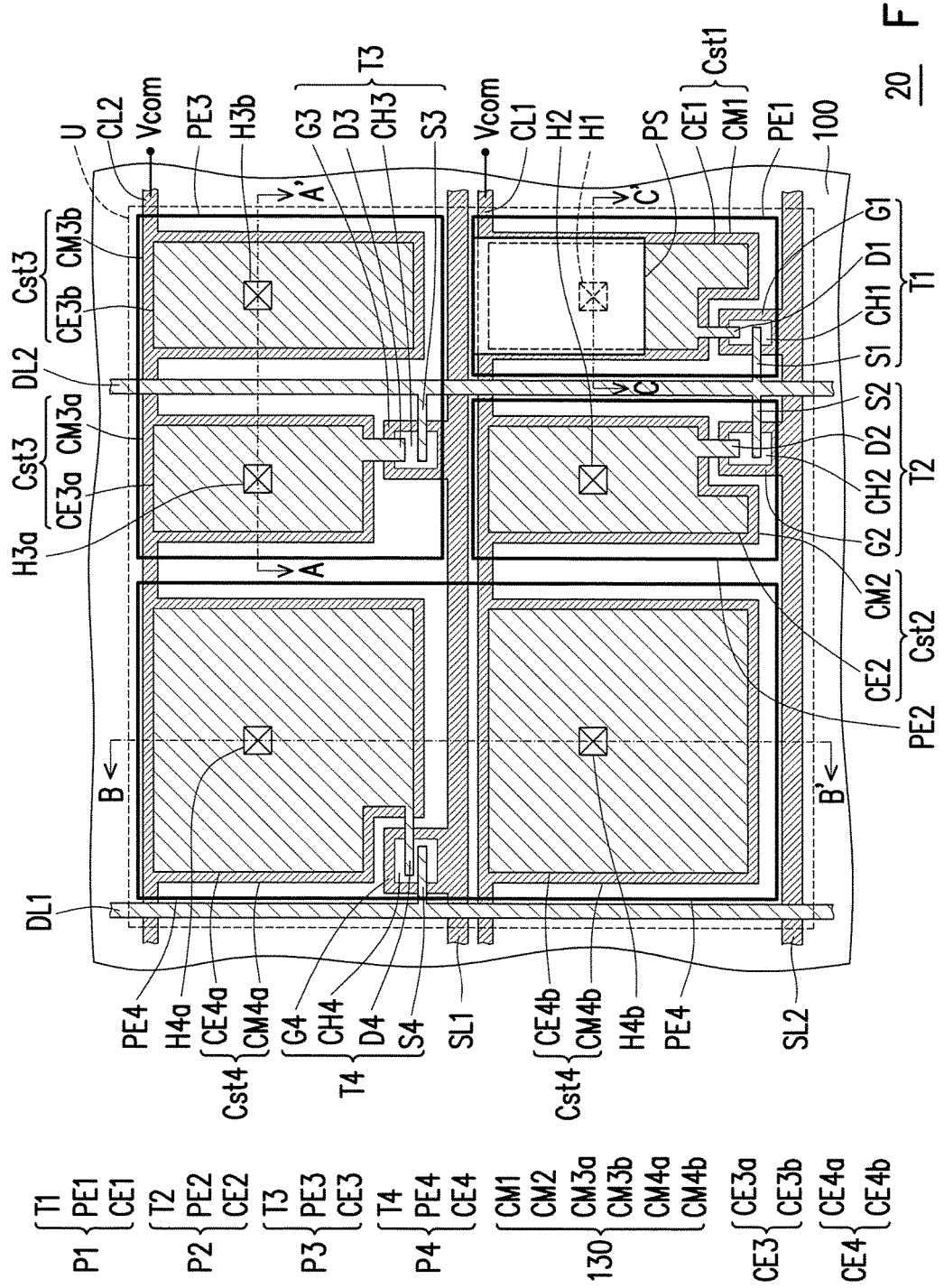
FIG. 3 is a schematic top view of a reflective LCD panel according to a second embodiment of the invention.
Figure 4:
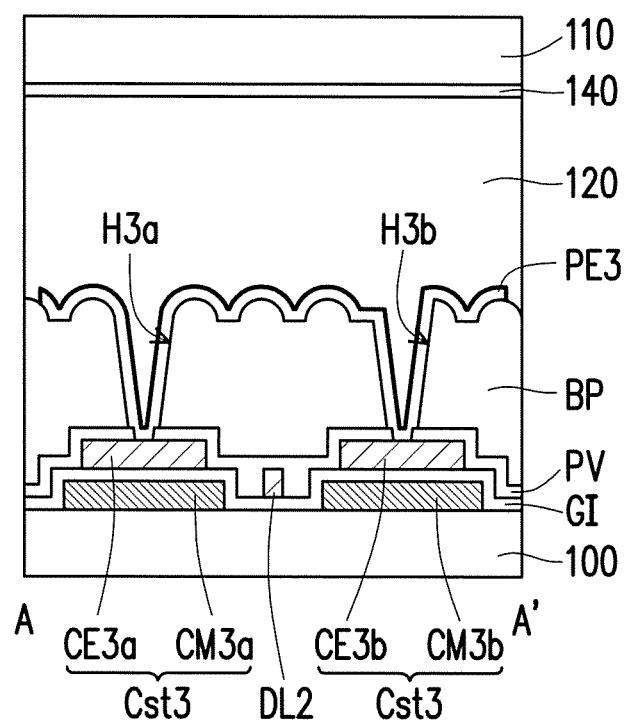
FIG. 4 is a schematic cross-sectional diagram of a sectional line A-A' in FIG. 3.
Figure 5:
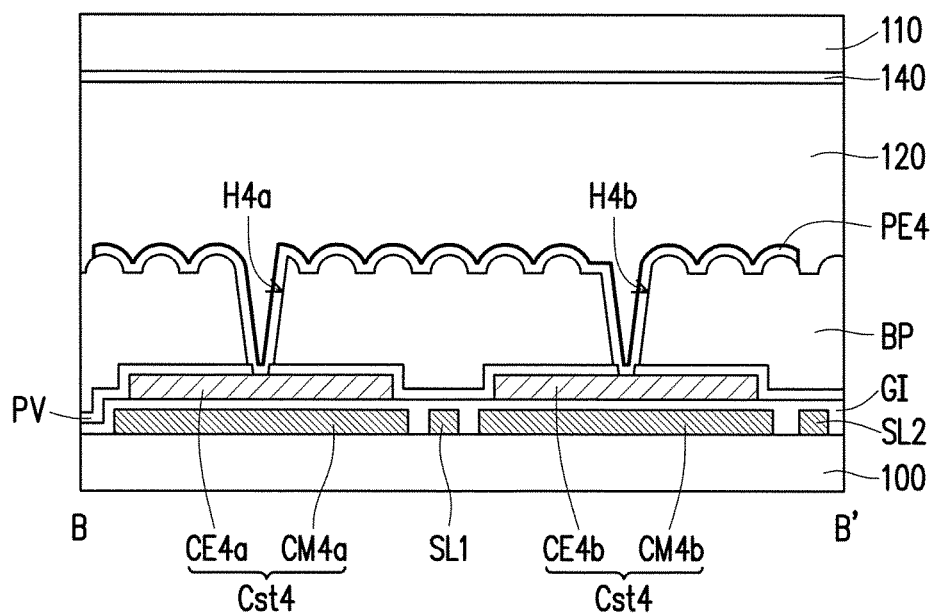
FIG. 5 is a schematic cross-sectional diagram of a sectional line B-B' in FIG. 3.
Figure 6:
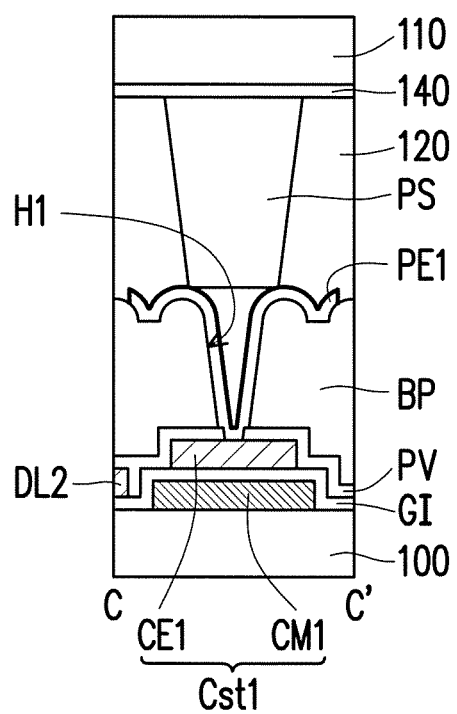
FIG. 6 is a schematic cross-sectional diagram of a sectional line C-C' in FIG. 3.

FIG. 3 is a schematic top view of a reflective LCD panel according to a second embodiment of the invention. FIG. 4 is a schematic cross-sectional diagram of a sectional line A-A' in FIG. 3. FIG. 5 is a schematic cross-sectional diagram of a sectional line B-B' in FIG. 3. FIG. 6 is a schematic cross-sectional diagram of a sectional line C-C' in FIG. 3. It is worth noting that a reflective LCD panel 20 in FIG. 3 and the reflective LCD panel 10 in FIG. 1 are similar, and the main difference between the two lies in a configuration framework of the first pixel structure P1, the second pixel structure P2, the third pixel structure P3, and the fourth pixel structure P4; moreover, the reflective LCD panel 20 further includes a spacer PS; therefore, the same or similar reference numerals are used to represent identical or similar elements, and hence relevant descriptions may be provided in the previous embodiments and will not be reiterated. The differences between the two will be described below.

Referring to FIG. 3 to FIG. 6, in the embodiment, the first pixel structure P1 is electrically connected to the second scan line SL2 and the second data line DL2, the second pixel structure P2 is electrically connected to the second scan line SL2 and the second data line DL2, the third pixel structure P3 is electrically connected to the first scan line SL1 and the second data line DL2, and the fourth pixel structure P4 is electrically connected to the first scan line SL1 and the first data line DL1. In other words, in the embodiment, the first pixel structure P1, the second pixel structure P2, and the third pixel structure P3 are electrically connected to the second data line DL2, and the fourth pixel structure P4 is electrically connected to the first data line DL1. Besides, the third pixel structure P3 and the fourth pixel structure P4 are electrically connected to the first scan line SL1, and the first pixel structure P1 and the second pixel structure P2 are electrically connected to the second scan line SL2.

In the embodiment, the area ratio of the reflective pixel electrode PE1 of the first pixel structure P1, the reflective pixel electrode PE2 of the second pixel structure P2, the reflective pixel electrode PE3 of the third pixel structure P3, and the reflective pixel electrode PE4 of the fourth pixel structure P4 is 1:1:2:4. Since the spacer PS which will be elaborated hereinafter is disposed in the first pixel structure P1, after deducting an area taken up by the spacer PS from the reflective pixel electrode PE1, it is observed that a reflective area of the reflective pixel electrode PE1 for reflecting an ambient light accounts for only half the original reflective area. Therefore, if the reflective areas of the reflective pixel electrode PE2, the reflective pixel electrode PE3, and the reflective pixel electrode PE4 remain unchanged, the reflective area ratio of the reflective pixel electrode PE1, the reflective pixel electrode PE2, the reflective pixel electrode PE3, and the reflective pixel electrode PE4 is 1:2:4:8.

Furthermore, in the embodiment, the capacitor electrode CE3 of the third pixel structure P3 includes a first capacitor electrode portion CE3a and a second capacitor electrode portion CE3b, and the first capacitor electrode portion CE3a and the second capacitor electrode portion CE3b are disposed on two sides of the second data line DL2, respectively. Specifically, since the capacitor electrode CE3 and the second data line DL2 belong to the same layer, the first capacitor electrode portion CE3a and the second capacitor electrode portion CE3*b* of the capacitor electrode CE3 may not be connected to each other directly. Accordingly, in the embodiment, the reflective pixel electrode PE3 of the third pixel structure P3 is electrically connected to the first capacitor electrode portion CE3*a* and the second capacitor electrode portion CE3*b* respectively through a contact hole H3*a* and a contact hole H3*b*; thereby, the third pixel structure PE3 has an adequate storage capacitor area. Specifically, the contact hole H3*a* is disposed in the cover layer BP and the insulation layer PV for exposing the first capacitor electrode portion CE3*a*, and the contact hole H3*b* is disposed in the cover layer BP and the insulation layer PV for exposing the second capacitor electrode portion CE3*b*.

The capacitor electrode CE4 of the fourth pixel structure P4 includes a third capacitor electrode portion CE4*a* and a fourth capacitor electrode portion CE4*b*, and the third capacitor electrode portion CE4*a* and the fourth capacitor electrode portion CE4*b* are disposed on two sides of the first scan line SL1, respectively. Specifically, the third capacitor electrode portion CE4*a* and the fourth capacitor electrode portion CE4*b* are not connected to each other directly, and the reflective pixel electrode PE4 of the fourth pixel structure P4 is electrically connected to the third capacitor electrode portion CE4*a* and the fourth capacitor electrode portion CE4*b* respectively through a contact hole H4*a* and a contact hole H4*b*, so as to reduce a parasitic capacitance on the first scan line SL1 and allow the fourth pixel structure P4 to have an adequate storage capacitor area. The contact hole H4*a* is disposed in the cover layer BP and the insulation layer PV for exposing the third capacitor electrode portion CE4*a*, and the contact hole H4*b* is disposed in the cover layer BP and the insulation layer PV for exposing the fourth capacitor electrode portion CE4*b*. As shown in the drawings, an area of the second capacitor electrode portion CE3*b* is larger than or equal to an area of the first capacitor electrode portion CE3*a*, and an area of the fourth capacitor electrode portion CE4*b* is larger than or equal to an area of the third capacitor electrode portion CE4*b*, depending on sizes of the active components T3 and T4.

Moreover, the capacitor electrode CE1 of the first pixel structure P1 has an area identical or similar to the area of the capacitor electrode CE2 of the second pixel structure P2.

In addition, according to the embodiment, the common electrode layer 130 includes the common electrode pattern CM1, the common electrode pattern CM2, a common electrode pattern CM3*a*, a common electrode pattern CM3*b*, a common electrode pattern CM4*a*, and a common electrode pattern CM4*b* respectively corresponding to the capacitor electrode CE1 of the first pixel structure P1, the capacitor electrode CE2 of the second pixel structure P2, the first capacitor electrode portion CE3*a* of the third pixel structure P3, the second capacitor electrode portion CE3*b* of the third pixel structure P3, the third capacitor electrode portion CE4*a* of the fourth pixel structure P4, and the fourth capacitor electrode portion CE4*b* of the fourth pixel structure P4. Thus, in the embodiment, the common electrode pattern CM1 of the common electrode layer 130 and the capacitor electrode CE1 of the first pixel structure P1 constitute a storage capacitor Cst1, the common electrode pattern CM2 of the common electrode layer 130 and the capacitor electrode CE2 of the second pixel structure P2 constitute a storage capacitor Cst2, the common electrode pattern CM3*a* and the common electrode pattern CM3*b* of the common electrode layer 130 and the first capacitor electrode portion CE3*a* and the second capacitor electrode portion CE3*b* of the third pixel structure P3 constitute a storage capacitor Cst3, and the common electrode pattern CM4*a* and the common electrode pattern CM4*b* of the common electrode layer 130 and the third capacitor electrode portion CE4*a* and the fourth capacitor electrode portion CE4*b* of the fourth pixel structure P4 constitute a storage capacitor Cst4.

It should be mentioned that in the embodiment, since the area ratio of the reflective pixel electrode PE1 of the first pixel structure P1, the reflective pixel electrode PE2 of the second pixel structure P2, the reflective pixel electrode PE3 of the third pixel structure P3, and the reflective pixel electrode PE4 of the fourth pixel structure P4 is 1:1:2:4, and the capacitor electrode CE1 and the common electrode pattern CM1 respectively have an area identical or similar to the area of the capacitor electrode CE2 and the area of the common electrode pattern CM2, the first pixel structure P1, the second pixel structure P2, the third pixel structure P3, and the fourth pixel structure P4 are equipped with adequate storage capacitor areas. Thus, in an operation environment of a low scanning frequency (e.g., 0.5 Hz to 2 Hz), the reflective LCD panel 20 provided in the embodiment may not have an abnormal screen display due to the insufficient pixel charge resulting from the overly small storage capacitor area; therefore, compared to the reflective LCD panel 10 provided in the first embodiment, the reflective LCD panel 20 given in the embodiment achieves favorable screen display effects.

From another point of view, in the embodiment, the common electrode pattern CM1, the common electrode pattern CM2, and the common electrode pattern CM4*b* are connected to one another and form a common electrode line CL1, the common electrode pattern CM3*a*, the common electrode pattern CM3*b*, and the common electrode pattern CM4*a* are connected to one another and foul' a common electrode line CL2, and the common electrode line CL1 and the common electrode line CL2 are electrically connected to the common voltage Vcom.

In addition, according to the embodiment, each pixel unit U further includes the spacer PS, and the spacer PS is disposed between the first substrate 100 and the second substrate 110 and covers a part of the reflective pixel electrode PE1 of the first pixel structure P1. Specifically, in the embodiment, the spacer PS is disposed on the opposite electrode 140 and extends to the reflective pixel electrode PE1 of the first pixel structure P1 (as shown in FIG. 6). The spacer PS is made of, for example, a photo-resist material or other opaque materials.

In the embodiment, although the area ratio of the reflective pixel electrode PE1, the reflective pixel electrode PE2, the reflective pixel electrode PE3, and the reflective pixel electrode PE4 is 1:1:2:4, by disposing the spacer PS, no liquid crystal molecule exists in a region where the spacer PS in the pixel unit U is located; thereby, the reflective area ratio of the first pixel structure P1, the second pixel structure P2, the third pixel structure P3, and the fourth pixel structure P4 is actually 1:2:4:8. In other words, the area ratio of the spacer PS, the reflective pixel electrode PE1, the reflective pixel electrode PE2, the reflective pixel electrode PE3, and the reflective pixel electrode PE4 may be 0.5:1:1:2:4 when viewing from a direction perpendicular to the first substrate 100. Since the spacer PS shields a part of the reflective pixel electrode PE1, the reflective area of the reflective pixel electrode PE1 that can reflect the ambient light is reduced by half. Similar to the first embodiment, the area ratio provided in the embodiment may fall within an error range acceptable to any technical field pertinent to the invention; that is to say, the error range is within a range of ±10% of an accurate value. Therefore, as the first pixel structure P1, the second pixel structure P2, the third pixel structure P3, and the fourth pixel structure P4 have the specific reflective area ratio, the reflective LCD panel 20 may display 16 gray scales and achieve good visual effects.

In the embodiment, the spacer PS is overlapped with the reflective pixel electrode PE1, but the invention is not limited hereto. In other embodiments, in order to prevent light leakage caused by the reflective pixel electrode PE1 located below the spacer PS from happening, the reflective pixel electrode PE1 may be designed not to be corresponding to spacer PS, that is to say, the spacer PS and the reflective pixel electrode PE1 are not overlapped, while the area ratio of the reflective pixel electrode PE1, the reflective pixel electrode PE2, the reflective pixel electrode PE3, and the reflective pixel electrode PE4 is 1:2:4:8. Since the reflective LCD panel 20 still includes the first pixel structure P1, the second pixel structure P2, the third pixel structure P3, and the fourth pixel structure P4 with the reflective area ratio of 1:2:4:8, 16 gray scales may be displayed.

In addition, according to the embodiment, the spacer PS is disposed on the second substrate 110, but people having ordinary skill in the art should understand that the spacer PS may also be disposed on the first substrate 100.

According to the second embodiment, similarly, each pixel unit U at least includes the first pixel structure P1, the second pixel structure P2, the third pixel structure P3, and the fourth pixel structure P4 with the reflective area ratio of 1:2:4:8, and the reflective LCD panel 20 may thus display at least 16 gray scales and achieve good visual effects. In addition, since the area ratio of the first pixel structure P1, the second pixel structure P2, the third pixel structure P3, and the fourth pixel structure P4 is approximately 1:1:2:4, and the capacitor electrode CE1 and the common electrode patter CM1 respectively have an area approximately similar to the area of the capacitor electrode CE2 and the area of the common electrode pattern CM2, the reflective LCD panel 20 may not experience a problem of abnormal screen display resulting from the overly small storage capacitor area of the first pixel structure P1 and thus may achieve good screen display effects.

Figure 7:
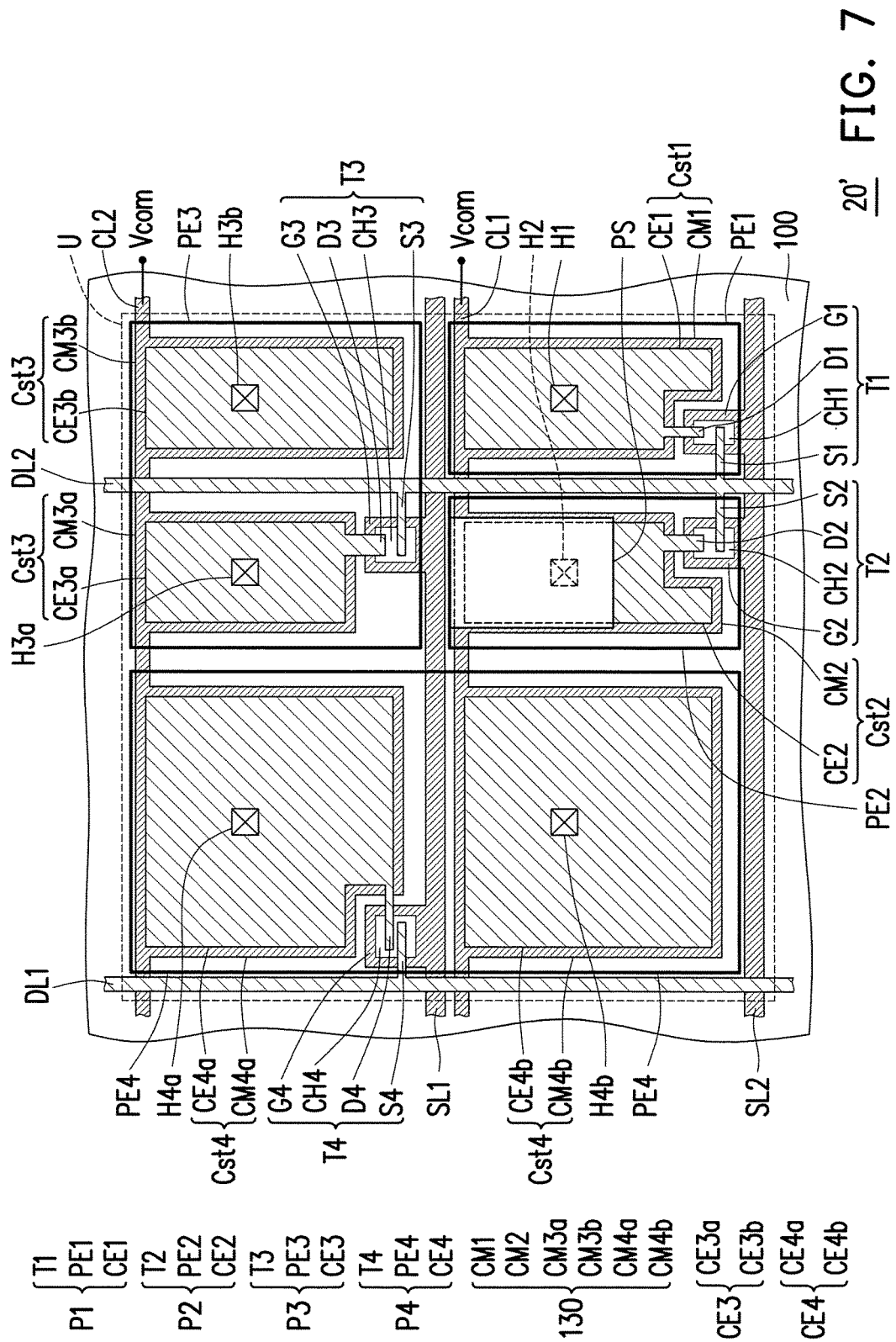
FIG. 7 is a schematic top view of a reflective LCD panel according to a third embodiment of the invention.

FIG. 7 is a schematic top view illustrating a reflective LCD panel according to a third embodiment of the invention. Specifically, the embodiment depicted in FIG. 7 and the embodiments illustrated in FIG. 3 to FIG. 6 are similar; therefore, identical or similar elements are denoted by the same or similar reference numerals, which will not be repeated hereinafter.

In FIG. 3 and FIG. 7, a main difference between the reflective LCD panel 20' and the reflective LCD panel 20 is that in the reflective LCD panel 20', the spacer PS covers a part of the reflective pixel electrode PE2, while the spacer PS covers a part of the reflective pixel electrode PE1 in the reflective LCD panel 20.

Thereby, in the reflective LCD panel 20', no liquid crystal molecules exist in a region of the pixel unit U where the spacer PS is located; accordingly, although the area ratio of the first pixel structure P1, the second pixel structure P2, the third pixel structure P3, and the fourth pixel structure P4 is 1:1:2:4, the effect of 2:1:4:8 can be actually accomplished. In particular, after the area occupied by the spacer PS is subtracted from the reflective area of the reflective pixel electrode PE2, the reflective area of the reflective pixel electrode PE2 that can reflect the ambient light is reduced by half, and the reflective areas of the other reflective pixel electrodes PE1, PE3, and PE4 remain unchanged. Hence, the actual reflective area ratio of the reflective pixel electrode PE1, the reflective pixel electrode PE2, the reflective pixel electrode PE3, and the reflective pixel electrode PE4 is 2:1:4:8. In other words, the area ratio of the spacer PS, the reflective pixel electrode PE1, the reflective pixel electrode PE2, the reflective pixel electrode PE3, and the reflective pixel electrode PE4 may be 0.5:1:1:2:4 when viewing from a direction perpendicular to the first substrate 100. Similar to the descriptions above, the area ratio provided in the embodiment may fall within an error range acceptable to any technical field pertinent to the invention; that is to say, the error range is within a range of ±10% of an accurate value. Therefore, as the first pixel structure P1, the second pixel structure P2, the third pixel structure P3, and the fourth pixel structure P4 have the specific reflective area ratio, the reflective LCD panel 20' may display 16 gray scales and achieve good visual effects.

Figure 8:
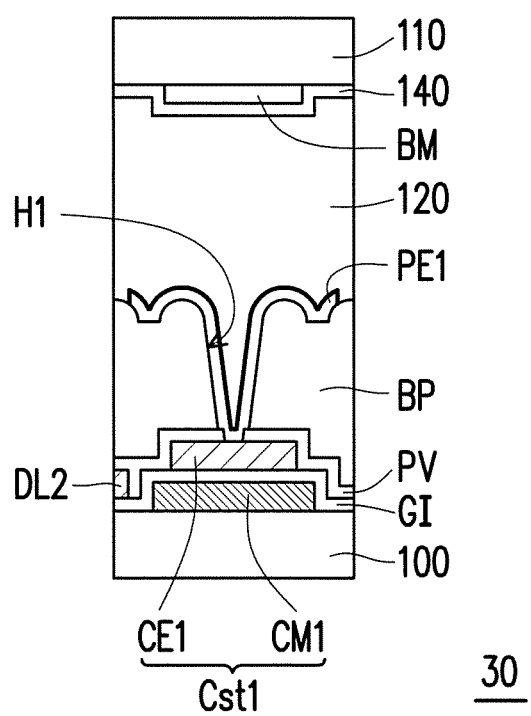
FIG. 8 is a schematic partial cross-sectional diagram illustrating a reflective LCD panel according to a fourth embodiment of the invention.

FIG. 8 is a schematic partial cross-sectional view illustrating a reflective LCD panel according to a fourth embodiment of the invention. The schematic top view of a reflective LCD panel 30 in FIG. 8 may be referred to as that provided in FIG. 3, and the cross-sectional position in FIG. 8 may be referred to as the position of the sectional line C-C' in FIG. 3. In addition, the embodiment depicted in FIG. 8 and the embodiments illustrated in FIG. 3 to FIG. 6 are similar; therefore, identical or similar elements are denoted by the same or similar reference numerals, which will not be repeated hereinafter.

In FIG. 6 and FIG. 8, a main difference between the reflective LCD panel 30 and the reflective LCD panel 20 is that in the reflective LCD panel 30, each pixel unit U includes a light-shielding pattern BM that is disposed on the second substrate 110 and covers a part of the reflective pixel electrode PE1 in a vertical projection direction of the second substrate 110, and no spacer is disposed. For instance, the spacer PS in FIG. 3 may be deemed as being replaced by the light-shielding pattern BM. The light-shielding element BM may be made of a material of low reflectivity, for example, black resin, light-shielding metal (e.g., chromium), and so on.

Specifically, in the present embodiment, by configuring the light-shielding pattern BM to shield a part of a reflected light coming from the reflective pixel electrode PE1 of the first pixel structure P1, even if the area ratio of the reflective pixel electrode PE1 of the first pixel structure P1, the reflective pixel electrode PE2 of the second pixel structure P2, the reflective pixel electrode PE3 of the third pixel structure P3, and the reflective pixel electrode PE4 of the fourth pixel structure P4 is 1:1:2:4, the reflection area ratio of the first pixel structure P1, the second pixel structure P2, the third pixel structure P3 and the fourth pixel structure P4 is still 1:2:4:8. In other words, the area ratio of the light-shielding pattern BM, the reflective pixel electrode PE1, the reflective pixel electrode PE2, the reflective pixel electrode PE3, and the reflective pixel electrode PE4 may be 0.5:1:1:2:4 when viewing from a direction perpendicular to the first substrate 100. Since the light-shielding pattern BM shields a part of the reflective pixel electrode PE1, the reflective area of the reflective pixel electrode PE1 that can reflect the ambient light is reduced by half. Similar to the area ratio provided in the first embodiment, the area ratio provided in the embodiment may fall within an error range acceptable to any technical field pertinent to the invention; that is to say, the error range is within a range of ±10% of an accurate value. Therefore, as the first pixel structure P1, the second pixel structure P2, the third pixel structure P3, and the fourth pixel structure P4 have the specific reflective area ratio, the reflective LCD panel 30 may display 16 gray scales and achieve good visual effects.

In the embodiment, the light-shielding pattern BM is disposed on the second substrate 110, but people having ordinary skill in the art should understand the light-shielding pattern BM may also be disposed on the first substrate 100.

According to the first embodiment and the fourth embodiment, similarly, each pixel unit U at least includes the first pixel structure P1, the second pixel structure P2, the third pixel structure P3, and the fourth pixel structure P4 with the reflective area ratio of 1:2:4:8, and the reflective LCD panel 30 may thus display at least 16 gray scales and achieve good visual effects.

Besides, according to the first embodiment, the third embodiment, and the fourth embodiment, the reflective LCD panel 300 can also arrange the light-shielding pattern BM in the vertical projection direction of the second substrate 110 to cover a part of the reflective pixel electrode PE2, such that each pixel unit U at least includes the first pixel structure P1, the second pixel structure P2, the third pixel structure P3, and the fourth pixel structure P4 with the reflective area ratio of 2:1:4:8. For instance, the spacer PS shown in FIG. 7 may be deemed as being replaced by the light-shielding pattern BM.

Figure 9:
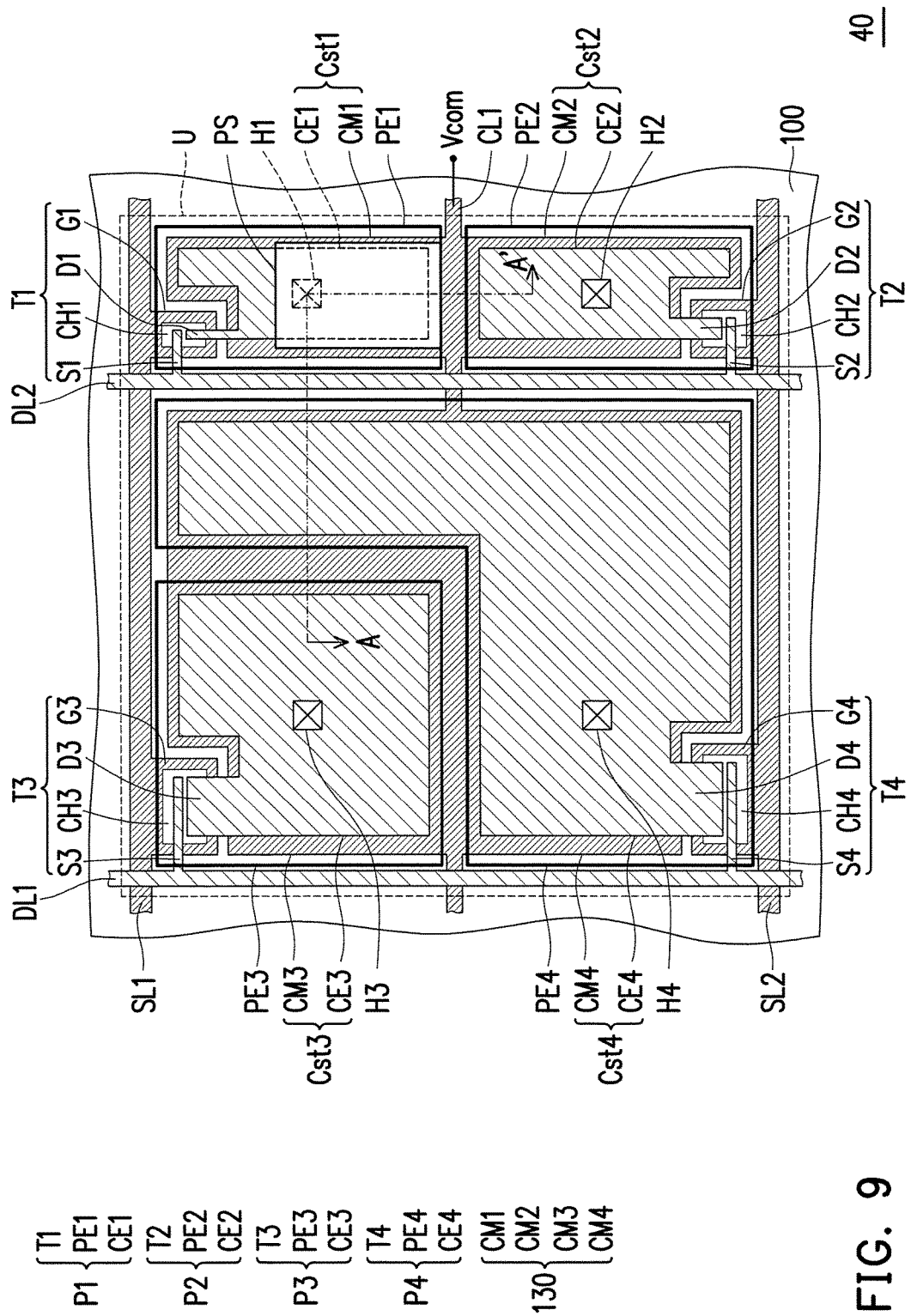
FIG. 9 is a schematic top view of a reflective LCD panel according to a fifth embodiment of the invention
Figure 10:
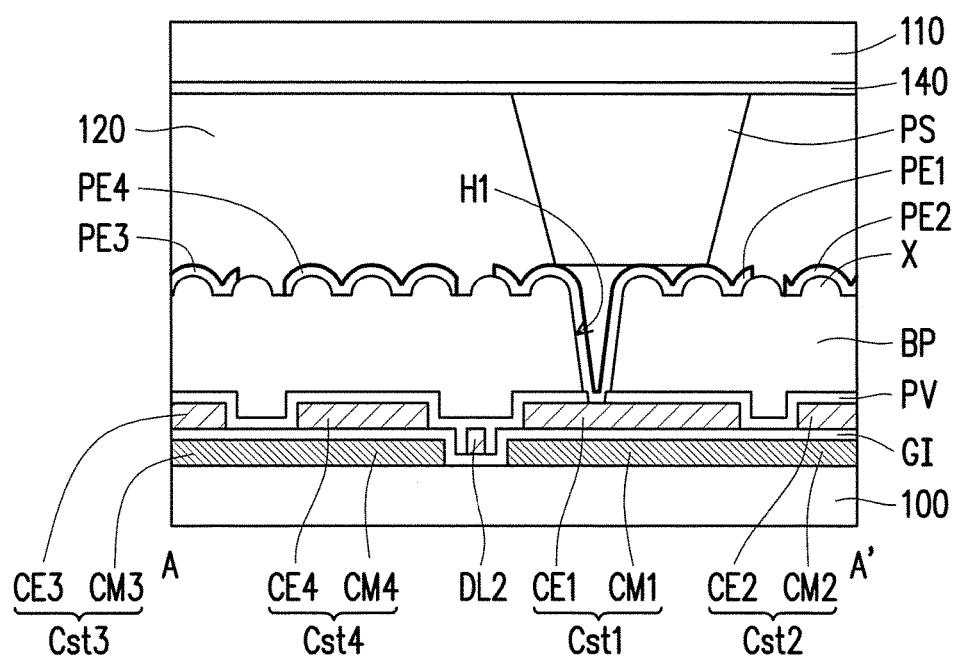
FIG. 10 is a schematic cross-sectional diagram of a sectional line A-A' in FIG. 9.

FIG. 9 is a schematic top view of a reflective LCD panel according to a fifth embodiment of the invention. FIG. 10 is a schematic cross-sectional diagram of a sectional line A-A' in FIG. 9. Note that the reflective LCD panel 40 depicted in FIG. 9 is similar to the reflective LCD panel 10 depicted in FIG. 1, while the main differences therebetween lie in the arrangement of the first pixel structure P1, the second pixel structure P2, the third pixel structure P3, and the fourth pixel structure P4 in these panels. Besides, the reflective LCD panel 40 further includes a spacer PS; therefore, identical or similar elements are denoted by the same or similar reference numerals, which will not be repeated hereinafter. The differences will, however, be explained below.

With reference to FIG. 9 and FIG. 10, in the present embodiment, the first pixel structure P1 is electrically connected to the first scan line SL1 and the second data line DL2, the second pixel structure P2 is electrically connected to the second scan line SL2 and the second data line DL2, the third pixel structure P3 is electrically connected to the first scan line SL1 and the first data line DL1, and the fourth pixel structure P4 is electrically connected to the second scan line SL2 and the first data line DL1. In other words, in the embodiment, the first pixel structure P1 and the second pixel structure P2 are electrically connected to the second data line DL2, the third pixel structure P3 and the fourth pixel structure P4 are electrically connected to the first data line DL1, the first pixel structure P1 and the third pixel structure P3 are electrically connected to the first scan line SL1, and the second pixel structure P2 and the fourth pixel structure P4 are electrically connected to the second scan line SL2. From another perspective, in the present embodiment, the first pixel structure P1 and the second pixel structure P2 are located on one side of the second data line DL2, and the third pixel structure P3 and the fourth pixel structure P4 are located on the other side of the second data line DL2. Here, all of the first, second, third, and fourth pixel structures P1, P2, P3, and P4 are located between the first scan line SL1 and the second scan line SL2.

It should be mentioned that the first pixel structure P1 and the second pixel structure P2 are located on one side of the second data line DL2, the third pixel structure P3 and the fourth pixel structure P4 are located on the other side of the second data line DL2, and all of the first, second, third, and fourth pixel structures P1, P2, P3, and P4 are located between the first scan line SL1 and the second scan line SL2, such that the capacitor electrodes CE1 to CE4 do not need to be divided to prevent the short circuit caused by contact with the data lines (i.e., the first data line DL1 and the second data line DL2) or to reduce the parasitic capacitance on the scan lines (i.e., the first data line DL1 and the second data line DL2). Thereby, in each pixel unit U, each of the reflective pixel electrodes PE1 to PE4 is electrically connected to one of the capacitor electrodes CE1 to CE4 through only one of the contact holes (i.e., the contact holes H1 to H4), which contributes to the favorable aperture ratio. For instance, compared to the reflective LCD panel in which the capacitor electrodes are divided to prevent being in contact with the data lines or to reduce the parasitic capacitance on the scan lines, the reflective LCD 40 provided in the present embodiment has the aperture ratio improved by 1.5% to 10%.

In the present embodiment, the area ratio of the reflective pixel electrode PE1 of the first pixel structure P1, the reflective pixel electrode PE2 of the second pixel structure P2, the reflective pixel electrode PE3 of the third pixel structure P3, and the reflective pixel electrode PE4 of the fourth pixel structure P4 is 1:1:2:4. In the first pixel structure P1, the spacer PS is arranged (which will be elaborated hereinafter); hence, after the area occupied by the spacer PS is subtracted from the reflective area of the reflective pixel electrode PE1, the reflective area of the reflective pixel electrode PE1 that can reflect the ambient light is reduced by half, and the reflective areas of the other reflective pixel electrodes PE2, PE3, and PE4 remain unchanged. Under said circumstances, the actual reflective area ratio of the reflective pixel electrode PE1, the reflective pixel electrode PE2, the reflective pixel electrode PE3, and the reflective pixel electrode PE4 is 1:2:4:8.

In the present embodiment, the capacitor electrode CE1 of the first pixel structure P1 has an area identical or similar to an area of the capacitor electrode CE2 of the second pixel structure P2. Besides, in the present embodiment, the common electrode pattern CM1 has an area identical or similar to an area of the common electrode pattern CM2.

In the present embodiment, note that the area ratio of the reflective pixel electrode PE1 of the first pixel structure P1, the reflective pixel electrode PE2 of the second pixel structure P2, the reflective pixel electrode PE3 of the third pixel structure P3, and the reflective pixel electrode PE4 of the fourth pixel structure P4 is 1:1:2:4, the capacitor electrode CE1 has the area identical or similar to the area of the capacitor electrode CE2, and the common electrode pattern CM1 has the area identical or similar to the area of the common electrode pattern CM2, whereby the first pixel structure P1, the second pixel structure P2, the third pixel structure P3, and the fourth pixel structure P4 have adequate storage capacitor areas. As such, in an operation environment of a low scanning frequency (e.g., 0.5 Hz to 2 Hz), the reflective LCD panel 40 provided in the embodiment may not have an abnormal screen display due to the insufficient pixel charge resulting from the overly small storage capacitor area. Compared to the reflective LCD panel 10 provided in the first embodiment, the reflective LCD panel 40 provided in the embodiment achieves favorable screen display effects.

Besides, in the present embodiment, the common electrode patterns CM1 to CM4 are connected to form a common electrode line CL1, and the common electrode line CL1 is electrically connected to the common voltage Vcom.

In this embodiment, each pixel unit U further includes the spacer PS located between the first substrate 100 and the second substrate 110, and the spacer PS covers a part of the reflective pixel electrode PE1 of the first pixel structure P1. Specifically, the spacer PS provided in the present embodiment is arranged on the opposite electrode layer 140 and extends to the reflective pixel electrode PE1 of the first pixel structure P1 (as shown in FIG. 10). The spacer PS is made of, for example, a photo-resist material or other opaque materials.

In the embodiment, although the area ratio of the reflective pixel electrode PE1, the reflective pixel electrode PE2, the reflective pixel electrode PE3, and the reflective pixel electrode PE4 is 1:1:2:4, by disposing the spacer PS, no liquid crystal molecule exists in a region where the spacer PS in the pixel unit U is located; thereby, the reflective area ratio of the first pixel structure P1, the second pixel structure P2, the third pixel structure P3, and the fourth pixel structure P4 actually achieves the effect of 1:2:4:8. In other words, the area ratio of the spacer PS, the reflective pixel electrode PE1, the reflective pixel electrode PE2, the reflective pixel electrode PE3, and the reflective pixel electrode PE4 may be 0.5:1:1:2:4 when viewing from a direction perpendicular to the first substrate 100. Since the spacer PS shields a part of the reflective pixel electrode PE1, the reflective area of the reflective pixel electrode PE1 that can reflect the ambient light is reduced by half. Similar to the first embodiment, the area ratio provided in the embodiment may fall within an error range acceptable to any technical field pertinent to the invention; that is to say, the error range is within a range of ±10% of an accurate value. Therefore, as the first pixel structure P1, the second pixel structure P2, the third pixel structure P3, and the fourth pixel structure P4 have the specific reflective area ratio, the reflective LCD panel 16 may display 16 gray scales and achieve good visual effects.

Additionally, in the embodiment, the spacer PS is overlapped with the reflective pixel electrode PE1, but the invention is not limited hereto. In other embodiments, in order to prevent light leakage caused by the reflective pixel electrode PE1 located below the spacer PS from happening, the reflective pixel electrode PE1 may be designed not to be corresponding to spacer PS, that is to say, the spacer PS and the reflective pixel electrode PE1 are not overlapped, while the area ratio of the reflective pixel electrode PE1, the reflective pixel electrode PE2, the reflective pixel electrode PE3, and the reflective pixel electrode PE4 is 1:2:4:8. Since the reflective LCD panel 40 still includes the first pixel structure P1, the second pixel structure P2, the third pixel structure P3, and the fourth pixel structure P4 with the reflective area ratio of 1:2:4:8, 16 gray scales may be displayed.

In addition, according to the embodiment, the spacer PS is disposed on the second substrate 110, but people having ordinary skill in the art should understand that the spacer PS may also be disposed on the first substrate 100.

Here, the first pixel structure P1 and the third pixel structure P3 are electrically connected to the first scan line SL1, and the second pixel structure P2 and the fourth pixel structure P4 are electrically connected to the second scan line SL1. However, the invention is not limited thereto. In another embodiment, when the first pixel structure P1 and the second pixel structure P2 are electrically connected to the second data line DL2, and the third pixel structure P3 and the fourth pixel structure P4 are electrically connected to the first data line DL1, the first pixel structure P1 and the fourth pixel structure P4 may also be electrically connected to the first scan line SL1, and the second pixel structure P2 and the third pixel structure P3 may also be electrically connected to the second scan line SL2.

As provided above, note that each pixel unit U at least includes the first pixel structure P1, the second pixel structure P2, the third pixel structure P3, and the fourth pixel structure P4 with the reflective area ratio of 1:2:4:8, and the reflective LCD panel 40 may thus display at least 16 gray scales and achieve good visual effects. In addition, since the area ratio of the first pixel structure P1, the second pixel structure P2, the third pixel structure P3, and the fourth pixel structure P4 is approximately 1:1:2:4, and the capacitor electrode CE1 and the common electrode patter CM1 respectively have an area approximately similar to the area of the capacitor electrode CE2 and the area of the common electrode pattern CM2, the reflective LCD panel 40 may not experience a problem of abnormal screen display resulting from the overly small storage capacitor area of the first pixel structure P1 and thus may achieve good screen display effects.

Figure 11:
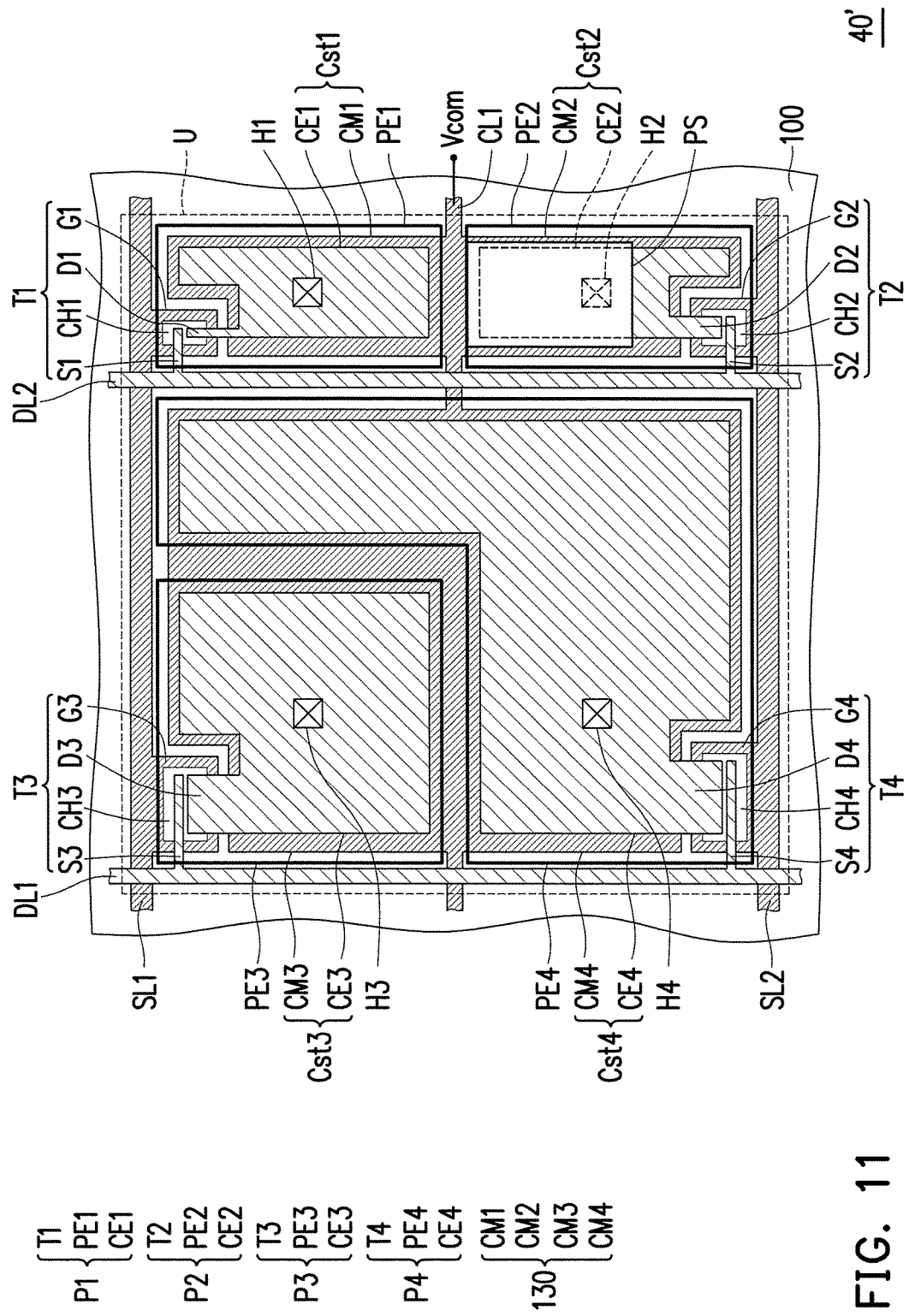
FIG. 11 is a schematic top view of a reflective LCD panel according to a sixth embodiment of the invention.

FIG. 11 is a schematic top view illustrating a reflective LCD panel according to a sixth embodiment of the invention. Specifically, the embodiment depicted in FIG. 11 and the embodiments illustrated in FIG. 9 and FIG. 10 are similar; therefore, identical or similar elements are denoted by the same or similar reference numerals, which will not be repeated hereinafter.

In FIG. 11 and FIG. 9, a main difference between the reflective LCD panel 40' and the reflective LCD panel 40 is that in the reflective LCD panel 40', the spacer PS covers a part of the reflective pixel electrode PE2, while the spacer PS covers a part of the reflective pixel electrode PE1 in the reflective LCD panel 40.

Thereby, in the reflective LCD panel 40', no liquid crystal molecules exist in a region of the pixel unit U where the spacer PS is located; accordingly, although the area ratio of the first pixel structure P1, the second pixel structure P2, the third pixel structure P3, and the fourth pixel structure P4 is 1:1:2:4, the effect of 2:1:4:8 can be actually accomplished. In particular, after the area occupied by the spacer PS is subtracted from the reflective area of the reflective pixel electrode PE2, the reflective area of the reflective pixel electrode PE2 that can reflect the ambient light is reduced by half, and the reflective areas of the other reflective pixel electrodes PE1, PE3, and PE4 remain unchanged. Hence, the actual reflective area ratio of the reflective pixel electrode PE1, the reflective pixel electrode PE2, the reflective pixel electrode PE3, and the reflective pixel electrode PE4 is 2:1:4:8. In other words, the area ratio of the spacer PS, the reflective pixel electrode PE1, the reflective pixel electrode PE2, the reflective pixel electrode PE3, and the reflective pixel electrode PE4 may be 0.5:1:1:2:4 when viewing from a direction perpendicular to the first substrate 100. Similar to the descriptions above, the area ratio provided in the embodiment may fall within an error range acceptable to any technical field pertinent to the invention; that is to say, the error range is within a range of ±10% of an accurate value. Therefore, as the first pixel structure P1, the second pixel structure P2, the third pixel structure P3, and the fourth pixel structure P4 have the specific reflective area ratio, the reflective LCD panel 40' may display 16 gray scales and achieve good visual effects.

Figure 12:
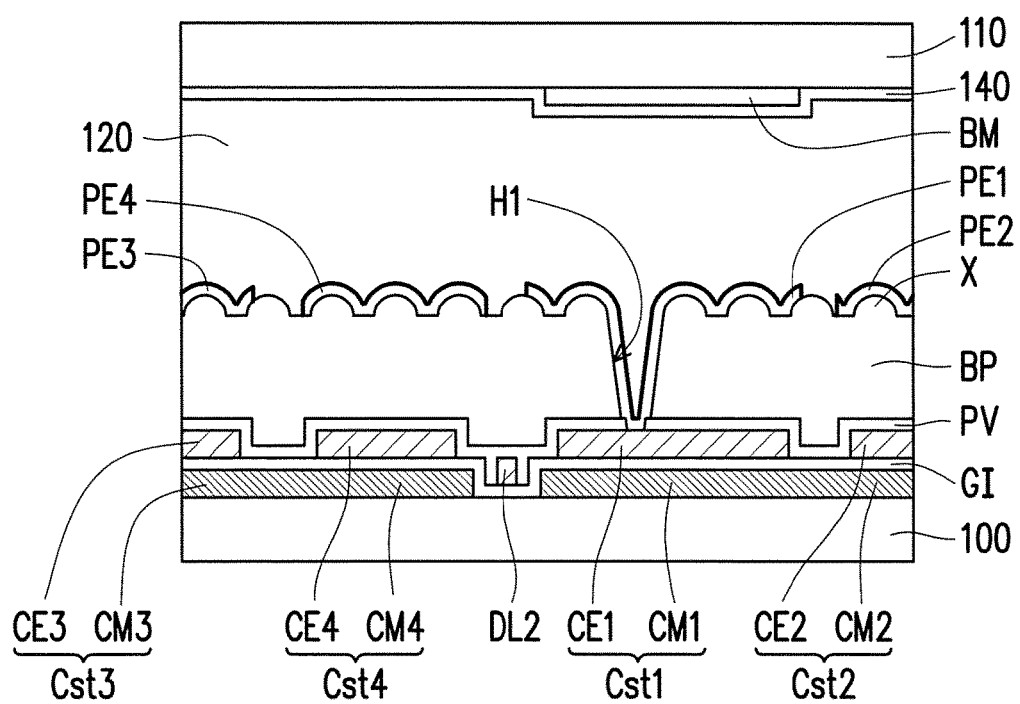
FIG. 12 is a schematic partial cross-sectional diagram illustrating a reflective LCD panel according to a seventh embodiment of the invention.

FIG. 12 is a schematic partial cross-sectional view illustrating a reflective LCD panel according to a seventh embodiment of the invention. The schematic top view of a reflective LCD panel 50 in FIG. 12 may be referred to as that provided in FIG. 9, and the cross-sectional position in FIG. 12 may be referred to as the position of the sectional line A-A' in FIG. 9. In addition, the embodiment depicted in FIG. 12 and the embodiments illustrated in FIG. 9 and FIG. 10 are similar; therefore, identical or similar elements are denoted by the same or similar reference numerals, which will not be repeated hereinafter.

In FIG. 10 and FIG. 12, a main difference between the reflective LCD panel 50 and the reflective LCD panel 40 is that in the reflective LCD panel 50, each pixel unit U includes a light-shielding pattern BM disposed on the second substrate 110 and covers a part of the reflective pixel electrode PE1 in a vertical projection direction of the second substrate 110, and no spacer is disposed. For instance, the spacer PS in FIG. 9 may be deemed as being replaced by the light-shielding pattern BM, and the light-shielding element BM may be made of a material of low reflectivity, for example, black resin, light-shielding metal (e.g., chromium), and so on.

Specifically, in the present embodiment, by configuring the light-shielding pattern BM to shield a part of a reflected light coming from the reflective pixel electrode PE1 of the first pixel structure P1, even if the area ratio of the reflective pixel electrode PE1 of the first pixel structure P1, the reflective pixel electrode PE2 of the second pixel structure P2, the reflective pixel electrode PE3 of the third pixel structure P3, and the reflective pixel electrode PE4 of the fourth pixel structure P4 is 1:1:2:4, the reflection area ratio of the first pixel structure P1, the second pixel structure P2, the third pixel structure P3 and the fourth pixel structure P4 is still 1:2:4:8. In other words, the area ratio of the light-shielding pattern BM, the reflective pixel electrode PE1, the reflective pixel electrode PE2, the reflective pixel electrode PE3, and the reflective pixel electrode PE4 may be 0.5:1:1:2:4 when viewing from a direction perpendicular to the first substrate 100. Since the light-shielding pattern BM shields a part of the reflective pixel electrode PE1, the reflective area of the reflective pixel electrode PE1 that can reflect the ambient light is reduced by half. Similar to the area ratio provided in the first embodiment, the area ratio provided in the embodiment may fall within an error range acceptable to any technical field pertinent to the invention; that is to say, the error range is within a range of ±10% of an accurate value. Therefore, as the first pixel structure P1, the second pixel structure P2, the third pixel structure P3, and the fourth pixel structure P4 have the specific reflective area ratio, the reflective LCD panel 50 may display 16 gray scales and achieve good visual effects.

In the embodiment, the light-shielding pattern BM is disposed on the second substrate 110, but people having ordinary skill in the art should understand the light-shielding pattern BM may also be disposed on the first substrate 100.

In view of the fifth embodiment, the sixth embodiment, and the seventh embodiment, in the reflective LCD panel 50, the light-shielding pattern BM can also be arranged in the vertical projection direction of the second substrate 110 to cover a part of the reflective pixel electrode PE2, and thereby the pixel unit U at least includes the first pixel structure P1, the second pixel structure P2, the third pixel structure P3, and the fourth pixel structure P4 with the reflective area ratio of 2:1:4:8. For instance, the spacer PS shown in FIG. 11 may be deemed as being replaced by the light-shielding pattern BM.

Figure 13:
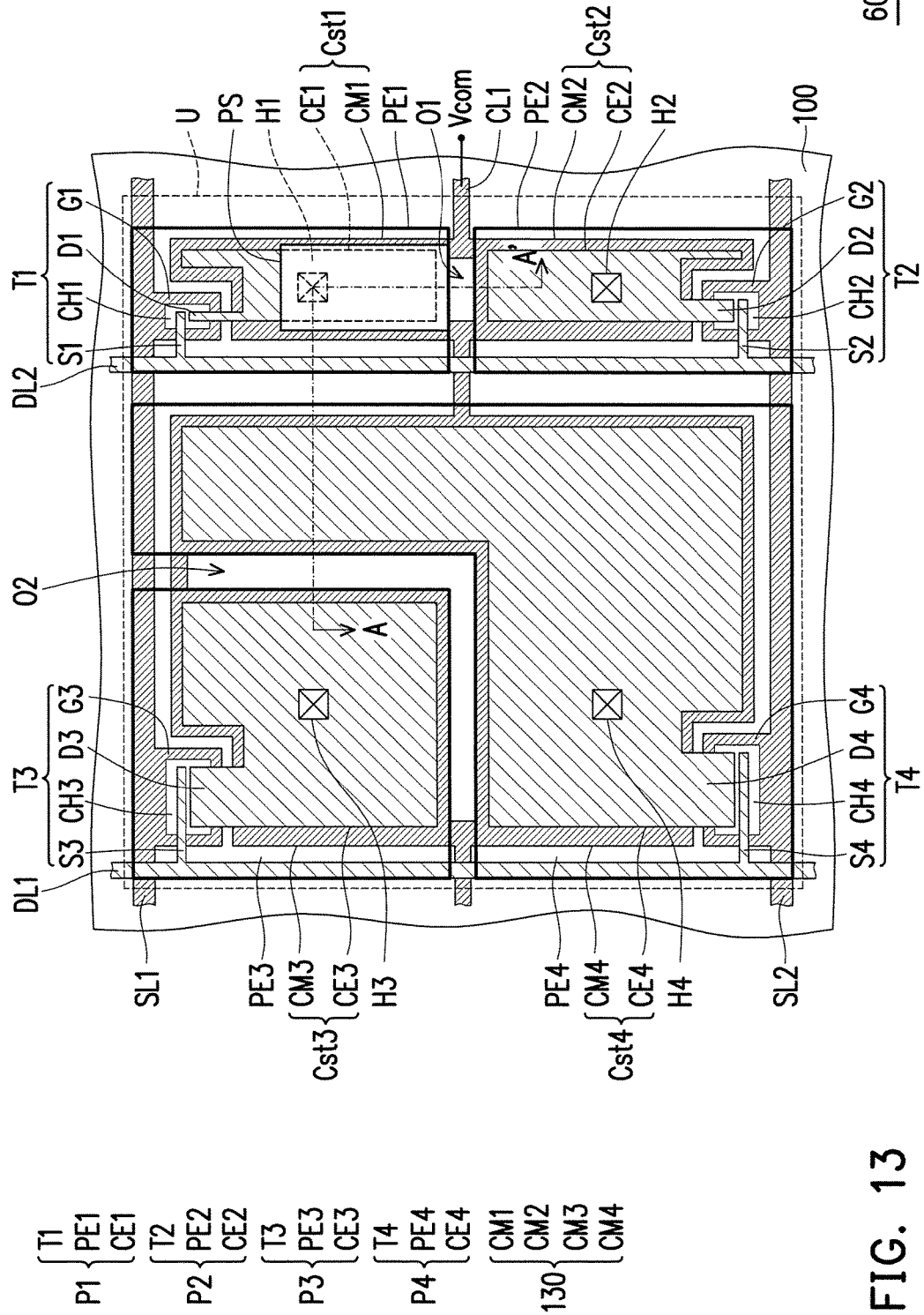
FIG. 13 is a schematic top view of a reflective LCD panel according to an eighth embodiment of the invention.
Figure 14:
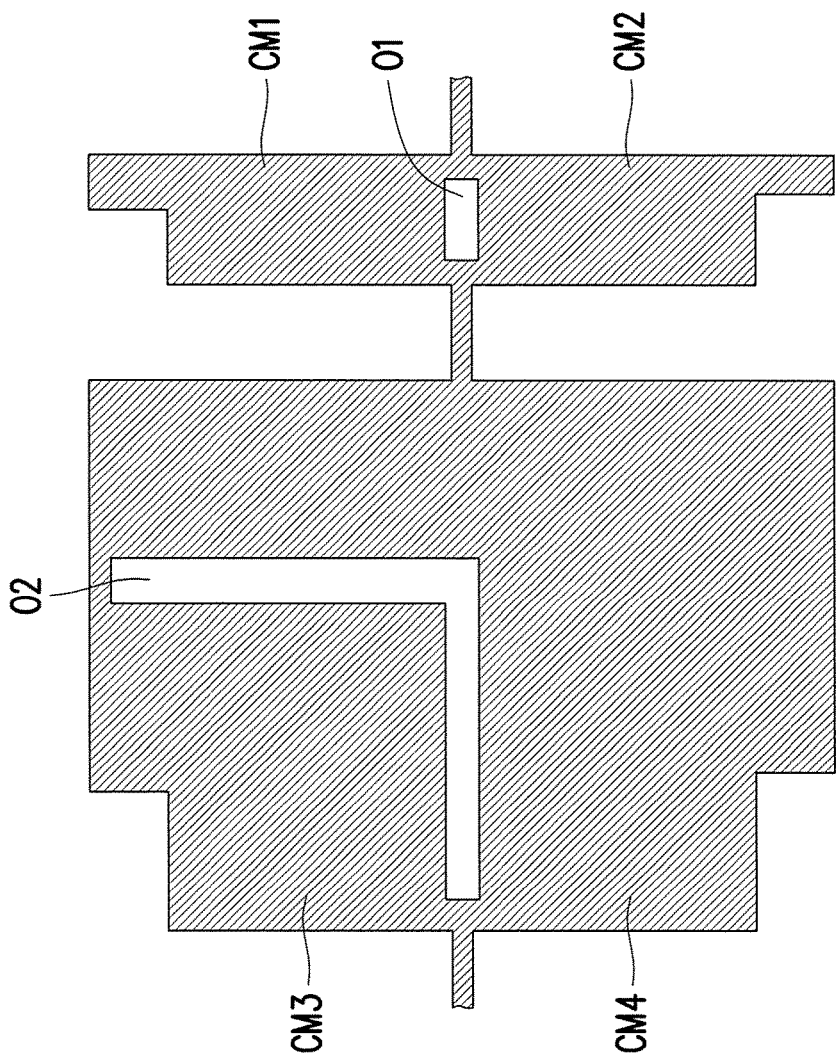
FIG. 14 is a schematic top view of the common electrode layer in FIG. 13.

FIG. 13 is a schematic top view illustrating a reflective LCD panel according to an eighth embodiment of the invention. FIG. 14 is a schematic top view of the common electrode layer in FIG. 13. Note that the reflective LCD panel 60 depicted in FIG. 7 and the reflective LCD panel 40 illustrated in FIG. 9 are similar, and the main differences therebetween lie in the arrangement of the reflective pixel electrodes PE1 to PE4 and the structure of the common electrode layer 130; therefore, identical or similar elements are denoted by the same or similar reference numerals, which will not be repeated hereinafter. The differences will, however, be explained below.

Figure 15:
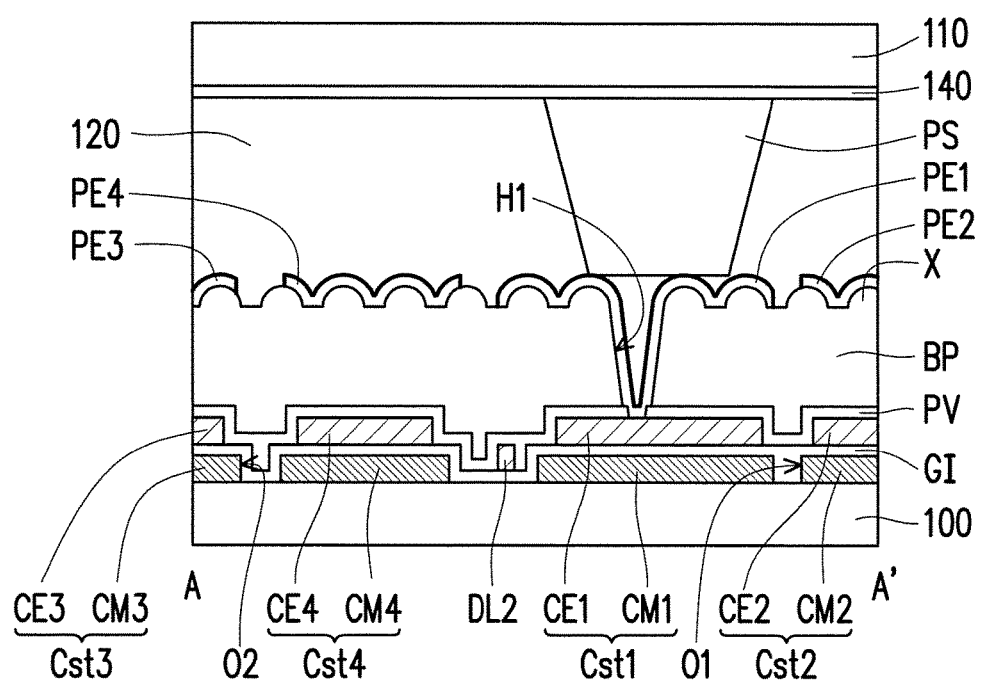
FIG. 15 is a schematic cross-sectional diagram of a sectional line A-A' in FIG. 13.

With reference to FIG. 13 to FIG. 15, in the present embodiment, the reflective pixel electrode PE1 of the first pixel structure P1 overlaps with a part of the second data line DL2 and a part of the first scan line SL1, the reflective pixel electrode PE2 of the second pixel structure P2 overlaps with a part of the second data line DL2 and a part of the second scan line SL2, the reflective pixel electrode PE3 of the third pixel structure P3 overlaps with a part of the first data line DL1 and a part of the first scan line SL1, and the reflective pixel electrode PE4 of the fourth pixel structure P4 overlaps with a part of the first data line DL1, a part of the first scan line SL1, and a part of the second scan line SL2.

Thereby, in the dark state, the liquid crystal molecules above the first scan line SL1, the second scan line SL2, the first data line DL1, and the second data line DL2 can be controlled to reduce the likelihood of light leakage resulting from the reflection of ambient light by the first scan line SL1, the second scan line SL2, the first data line DL1, and the second data line DL2. Hence, compared to the reflective LCD panel 40 provided in the fifth embodiment, the reflective LCD panel 60 in the present embodiment effectively resolves the light leakage issue caused by the first scan line SL1, the second scan line SL2, the first data line DL1, and the second data line DL2. As a result, favorable contrast can be achieved in the dark state.

According to the present embodiment, the common electrode layer 130 has a first opening O1 and a second opening O2. The first opening O1 corresponds to a space between the reflective pixel electrode PE1 of the first pixel structure P1 and the reflective pixel electrode PE2 of the second pixel structure P2, i.e., the first opening O1 is located between the common electrode pattern CM1 and the common electrode pattern CM2. The second opening O2 corresponds to a space between the reflective pixel electrode PE3 of the third pixel structure P3 and the reflective pixel electrode PE4 of the fourth pixel structure P4, i.e., the second opening O2 is located between the common electrode pattern CM3 and the common electrode pattern CM4. Thereby, in the reflective LCD panel 60, the area of the common electrode layer 130 not covered by the reflective pixel electrodes PE1 to PE4 is reduced, and thus the possibility of light leakage resulting from reflecting the ambient light by the common electrode layer 130 in the dark state is effectively lessened. Compared to the reflective LCD panel 40 provided in the fifth embodiment, the reflective LCD panel 60 in the present embodiment effectively resolves the light leakage issue caused by the common electrode layer 130. As a result, favorable contrast can be achieved in the dark state.

In view of the fifth embodiment, the sixth embodiment, and the eighth embodiment, in the reflective LCD panel 60, the spacer PS can also be arranged to cover a part of the reflective pixel electrode PE2, and thereby the pixel unit U at least includes the first pixel structure P1, the second pixel structure P2, the third pixel structure P3, and the fourth pixel structure P4 with the reflective area ratio of 2:1:4:8.

Figure 16:
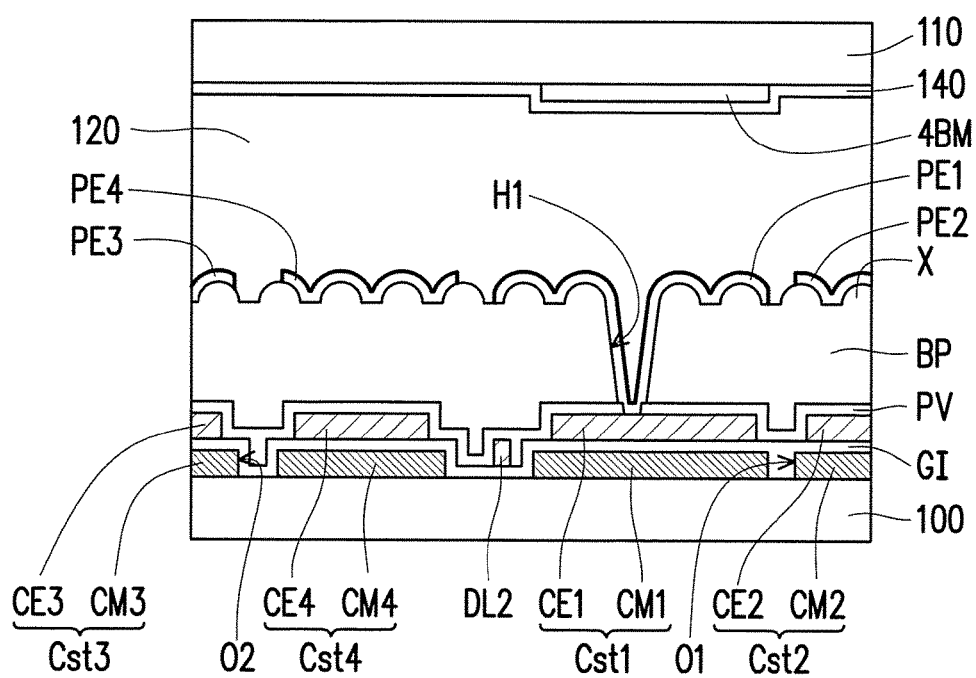
FIG. 16 is a schematic partial cross-sectional diagram illustrating a reflective LCD panel according to a ninth embodiment of the invention.

FIG. 16 is a schematic partial cross-sectional view illustrating a reflective LCD panel according to a ninth embodiment of the invention. The schematic top view of a reflective LCD panel 70 in FIG. 16 may be referred to as that provided in FIG. 13, and the cross-sectional position in FIG. 16 may be referred to as the position of the sectional line A-A' in FIG. 13. In addition, the embodiment depicted in FIG. 16 and the embodiments illustrated in FIG. 13 to FIG. 15 are In FIG. 15 and FIG. 16, a main difference between the reflective LCD panel 70 and the reflective LCD panel 60 is that in the reflective LCD panel 70, each pixel unit U includes a light-shielding pattern 4BM disposed on the second substrate 110 and covers a part of the reflective pixel electrode PE1 in a vertical projection direction of the second substrate 110, and no spacer is disposed. For instance, the spacer PS in FIG. 13 may be deemed as being replaced by the light-shielding pattern 4BM. The light-shielding element 4BM may be made of a material of low reflectivity, for example, black resin, light-shielding metal (e.g., chromium), and so on.

Specifically, in the present embodiment, by configuring the light-shielding pattern BM to shield a part of a reflected light coming from the reflective pixel electrode PE1 of the first pixel structure P1, even if the area ratio of the reflective pixel electrode PE1 of the first pixel structure P1, the reflective pixel electrode PE2 of the second pixel structure P2, the reflective pixel electrode PE3 of the third pixel structure P3, and the reflective pixel electrode PE4 of the fourth pixel structure P4 is 1:1:2:4, the reflection area ratio of the first pixel structure P1, the second pixel structure P2, the third pixel structure P3 and the fourth pixel structure P4 is still 1:2:4:8. In other words, the area ratio of the light-shielding pattern 4BM, the reflective pixel electrode PE1, the reflective pixel electrode PE2, the reflective pixel electrode PE3, and the reflective pixel electrode PE4 may be 0.5:1:1:2:4 when viewing from a direction perpendicular to the first substrate 100. Since the light-shielding pattern 4BM shields a part of the reflective pixel electrode PE1, the reflective area of the reflective pixel electrode PE1 that can reflect the ambient light is reduced by half. Similarly, the area ratio provided in the embodiment may fall within an error range acceptable to any technical field pertinent to the invention; that is to say, the error range is within a range of ±10% of an accurate value. Therefore, as the first pixel structure P1, the second pixel structure P2, the third pixel structure P3, and the fourth pixel structure P4 have the specific reflective area ratio, the reflective LCD panel 70 may display 16 gray scales and achieve good visual effects.

In addition, according to the embodiment, the light-shielding pattern 4BM is disposed on the second substrate 110, but people having ordinary skill in the art should understand that the light-shielding pattern 4BM may also be disposed on the first substrate 100.

In view of the fifth embodiment, the sixth embodiment, and the ninth embodiment, in the reflective LCD panel 70, the light-shielding pattern 4BM can also be arranged in the vertical projection direction of the second substrate 110 to cover a part of the reflective pixel electrode PE2, and thereby the pixel unit U at least includes the first pixel structure P1, the second pixel structure P2, the third pixel structure P3, and the fourth pixel structure P4 with the reflective area ratio of 2:1:4:8.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A reflective liquid crystal display (LCD) panel comprising a plurality of pixel units, each pixel unit comprising:

a first substrate;

a first scan line, a second scan line, a first data line, and a second data line, disposed on the first substrate;

a first pixel structure, a second pixel structure, a third pixel structure, and a fourth pixel structure, respectively electrically connected to one of the first scan line and the second scan line and one of the first data line and the second data line, wherein the first pixel structure, the second pixel structure, the third pixel structure, and the fourth pixel structure respectively comprise:

an active component; and a reflective pixel electrode electrically connected to the active component, wherein a reflective area ratio of the first pixel structure, the second pixel structure, the third pixel structure, and the fourth pixel structure being 1:2:4:8 or 2:1:4:8;

a second substrate disposed opposite to the first substrate; and a liquid crystal layer disposed between the first substrate and the second substrate, wherein an area ratio of the reflective pixel electrode of the first pixel structure, the reflective pixel electrode of the second pixel structure, the reflective pixel electrode of the third pixel structure, and the reflective pixel electrode of the fourth pixel structure is 1:1:2:4.

2. The reflective LCD panel as claimed in claim 1, wherein the fourth pixel structure is electrically connected to the first data line, the first pixel structure, the second pixel structure and the third pixel structure are electrically connected to the second data line, the third pixel structure and the fourth pixel structure are electrically connected to the first scan line, and the first pixel structure and the second pixel structure are electrically connected to the second scan line.

3. The reflective LCD panel as claimed in claim 2, wherein the first pixel structure, the second pixel structure, the third pixel structure, and the fourth pixel structure respectively comprise a capacitor electrode electrically connected to the reflective pixel electrode.

4. The reflective LCD panel as claimed in claim 3, wherein the capacitor electrode of the third pixel structure comprises a first capacitor electrode portion and a second capacitor electrode portion, while the first capacitor electrode portion and the second capacitor electrode portion are disposed on two sides of the second data line, and the capacitor electrode of the fourth pixel structure comprises a third capacitor electrode portion and a fourth capacitor electrode portion, while the third capacitor electrode portion and the fourth capacitor electrode portion are disposed on two sides of the first scan line.

5. The reflective LCD panel as claimed in claim 4, wherein the reflective pixel electrode of the third pixel structure is electrically connected to the first capacitor electrode portion and the second capacitor electrode portion respectively through a first contact hole and a second contact hole, and the reflective pixel electrode of the fourth pixel structure is electrically connected to the third capacitor electrode portion and the fourth capacitor electrode portion respectively through a third contact hole and a fourth contact hole.

6. The reflective LCD panel as claimed in claim 4, wherein each of the pixel units comprises a common electrode layer electrically insulated from the reflective pixel electrode, and the common electrode layer comprises a plurality of common electrode patterns which respectively correspond to the capacitor electrode of the first pixel structure, the capacitor electrode of the second pixel structure, the capacitor electrode of the third pixel structure, and the capacitor electrode of the fourth pixel structure.

7. The reflective LCD panel as claimed in claim 2, wherein each of the pixel units further comprises a spacer, the spacer is disposed between the first substrate and the second substrate and covers a part of the reflective pixel electrode of the first pixel structure, and the reflective area ratio of the first pixel structure, the second pixel structure, the third pixel structure, and the fourth pixel structure is 1:2:4:8.

8. The reflective LCD panel as claimed in claim 2, wherein each of the pixel units further comprises a spacer, the spacer is disposed between the first substrate and the second substrate and covers a part of the reflective pixel electrode of the second pixel structure, and the reflective area ratio of the first pixel structure, the second pixel structure, the third pixel structure, and the fourth pixel structure is 2:1:4:8.

9. The reflective LCD panel as claimed in claim 2, wherein each of the pixel units further comprises a light-shielding pattern, the light-shielding pattern is disposed on the first substrate or the second substrate and covers a part of the reflective pixel electrode of the first pixel structure, and the reflective area ratio of the first pixel structure, the second pixel structure, the third pixel structure, and the fourth pixel structure is 1:2:4:8.

10. The reflective LCD panel as claimed in claim 2, wherein each of the pixel units further comprises a light-shielding pattern, the light-shielding pattern is disposed on the first substrate or the second substrate and covers a part of the reflective pixel electrode of the second pixel structure, and the reflective area ratio of the first pixel structure, the second pixel structure, the third pixel structure, and the fourth pixel structure is 2:1:4:8.

11. The reflective LCD panel as claimed in claim 1, wherein the third pixel structure and the fourth pixel structure are electrically connected to the first data line, the first pixel structure and the second pixel structure are electrically connected to the second data line, the first pixel structure and the third pixel structure are electrically connected to the first scan line, and the second pixel structure and the fourth pixel structure are electrically connected to the second scan line.

12. The reflective LCD panel as claimed in claim 11, wherein the first pixel structure and the second pixel structure are disposed on one side of the second data line, and the third pixel structure and the fourth pixel structure are disposed on the other side of the second data line.

13. The reflective LCD panel as claimed in claim 11, wherein each of the pixel units further comprises a spacer, the spacer is disposed between the first substrate and the second substrate and covers a part of the reflective pixel electrode of the first pixel structure, and the reflective area ratio of the first pixel structure, the second pixel structure, the third pixel structure, and the fourth pixel structure is 1:2:4:8.

14. The reflective LCD panel as claimed in claim 11, wherein each of the pixel units further comprises a spacer, the spacer is disposed between the first substrate and the second substrate and covers a part of the reflective pixel electrode of the second pixel structure, and the reflective area ratio of the first pixel structure, the second pixel structure, the third pixel structure, and the fourth pixel structure is 2:1:4:8.

15. The reflective LCD panel as claimed in claim 11, wherein each of the pixel units further comprises a light-shielding pattern, the light-shielding pattern is disposed on the first substrate or the second substrate and shields a part of the reflective pixel electrode of the first pixel structure in a vertical projection direction of the second substrate, and the reflective area ratio of the first pixel structure, the second pixel structure, the third pixel structure, and the fourth pixel structure is 1:2:4:8.

16. The reflective LCD panel as claimed in claim 11, wherein each of the pixel units further comprises a light-shielding pattern, the light-shielding pattern is disposed on the first substrate or the second substrate and shields a part of the reflective pixel electrode of the second pixel structure in a vertical projection direction of the second substrate, and the reflective area ratio of the first pixel structure, the second pixel structure, the third pixel structure, and the fourth pixel structure is 2:1:4:8.

17. The reflective LCD panel as claimed in claim 11, wherein the reflective pixel electrode of the first pixel structure overlaps with a part of the second data line and a part of the first scan line, the reflective pixel electrode of the second pixel structure overlaps with a part of the second data line and a part of the second scan line, the reflective pixel electrode of the third pixel structure overlaps with a part of the first data line and a part of the first scan line, and the reflective pixel electrode of the fourth pixel structure overlaps with a part of the first data line, a part of the first scan line, and a part of the second scan line.

18. The reflective LCD panel as claimed in claim 11, wherein each of the pixel units further comprises a common electrode layer electrically insulated from the reflective pixel electrode, the common electrode layer comprises a first opening and a second opening, the first opening corresponds to a space between the reflective pixel electrode of the first pixel structure and the reflective pixel electrode of the second pixel structure, and the second opening corresponds to a space between the reflective pixel electrode of the third pixel structure and the reflective pixel electrode of the fourth pixel structure.

* * * * *